(12) United States Patent
Kocaman et al.

(10) Patent No.: US 7,170,964 B2
(45) Date of Patent: Jan. 30, 2007

(54) TRANSITION INSENSITIVE TIMING RECOVERY METHOD AND APPARATUS

(75) Inventors: Namik Kocaman, Irvine, CA (US); Afshin Momtaz, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 736 days.

(21) Appl. No.: 10/355,848

(22) Filed: Jan. 31, 2003

(65) Prior Publication Data
US 2004/0030513 A1 Feb. 12, 2004

Related U.S. Application Data

(60) Provisional application No. 60/401,792, filed on Aug. 7, 2002.

(51) Int. Cl.
*H03D 3/24* (2006.01)

(52) U.S. Cl. .................. 375/376; 342/442; 375/373; 375/375; 455/180.3

(58) Field of Classification Search ............... 327/149, 327/277; 331/1 A, 25; 375/347, 364, 367, 375/376, 342, 359; 702/75
See application file for complete search history.

(56) References Cited

U.S. PATENT DOCUMENTS 4,847,876 A * 7/1989 Baumbach et al. ......... 375/364
5,455,540 A * 10/1995 Williams .................... 331/1 A
5,661,765 A * 8/1997 Ishizu ........................ 375/376
5,754,437 A * 5/1998 Blazo ........................... 702/75
6,008,680 A * 12/1999 Kyles et al. ................ 327/277
6,166,572 A * 12/2000 Yamaoka .................... 327/149

* cited by examiner

*Primary Examiner*—Mohammed Ghayour
*Assistant Examiner*—Adolf DSouza
(74) *Attorney, Agent, or Firm*—Garlick Harrison & Markison; Timothey W. Markison

(57) ABSTRACT

A timing recovery circuit comprises a data-driven phase detector and a digital loop filter. The data-driven phase detector is operably coupled to determine at least a phase difference between an input signal and a feedback clock signal to produce a difference signal. Determining the phase difference can comprise digitally determining a timing difference between the input signal and the feedback clock signal, digitally determining a transition of the input signal to produce a transition detect signal, and digitally updating the timing difference based on the transition detect signal and the feedback clock signal. The timing difference can be digitally updated by pre-filtering the timing difference BY TAKING EVERY N TRANSITON OR AVERAGE OF EVERY N TRANSITIONS at a digital pre-filter, based on a pre-filter clock signal produced from the transition detect signal and the feedback clock signal, to produce the difference signal. The loop filter is operably coupled to filter the difference signal to produce a control voltage.

32 Claims, 23 Drawing Sheets timing recovery circuit
30 prior art PLL-based timing recovery circuit prior art DLL-based timing recovery circuit

*prior art phase interpolator as delay cell* data input and feedback
clock timing
relationships phase detector output timing diagram

|   | Logic High (1) | Logic Low (0) |
|---|---|---|
| A | Clock is Late | Clock is Early |
| B | Clock is Early | Clock is Late |
| C | Clock is Late | Clock is Early |
| D | Clock is Early | Clock is Late |

FIG. 7
phase detector decision criteria based on XOR outputs prior art implementation of phase detector decision logic transistor-level schematic of CML implementation of XOR gate conceptual symbol for CML implementation of XOR gate prior art analog implementation of decision logic combined with loop filter comparator input node in prior art analog implementation of decision logic Comp In and Late/Early nodes timing for analog implementation of decision logic improved prior art
analog implementation
of decision logic Comp In, Late/Early and Transition node timing for improved analog implementation of decision logic Comp In, Late/Early and Transition n de timing for improved analog implementation of decision logic optical interface 10 optical receiver 20 or 22 timing recovery circuit 30 desired phase alignment alternative timing recovery circuit 30

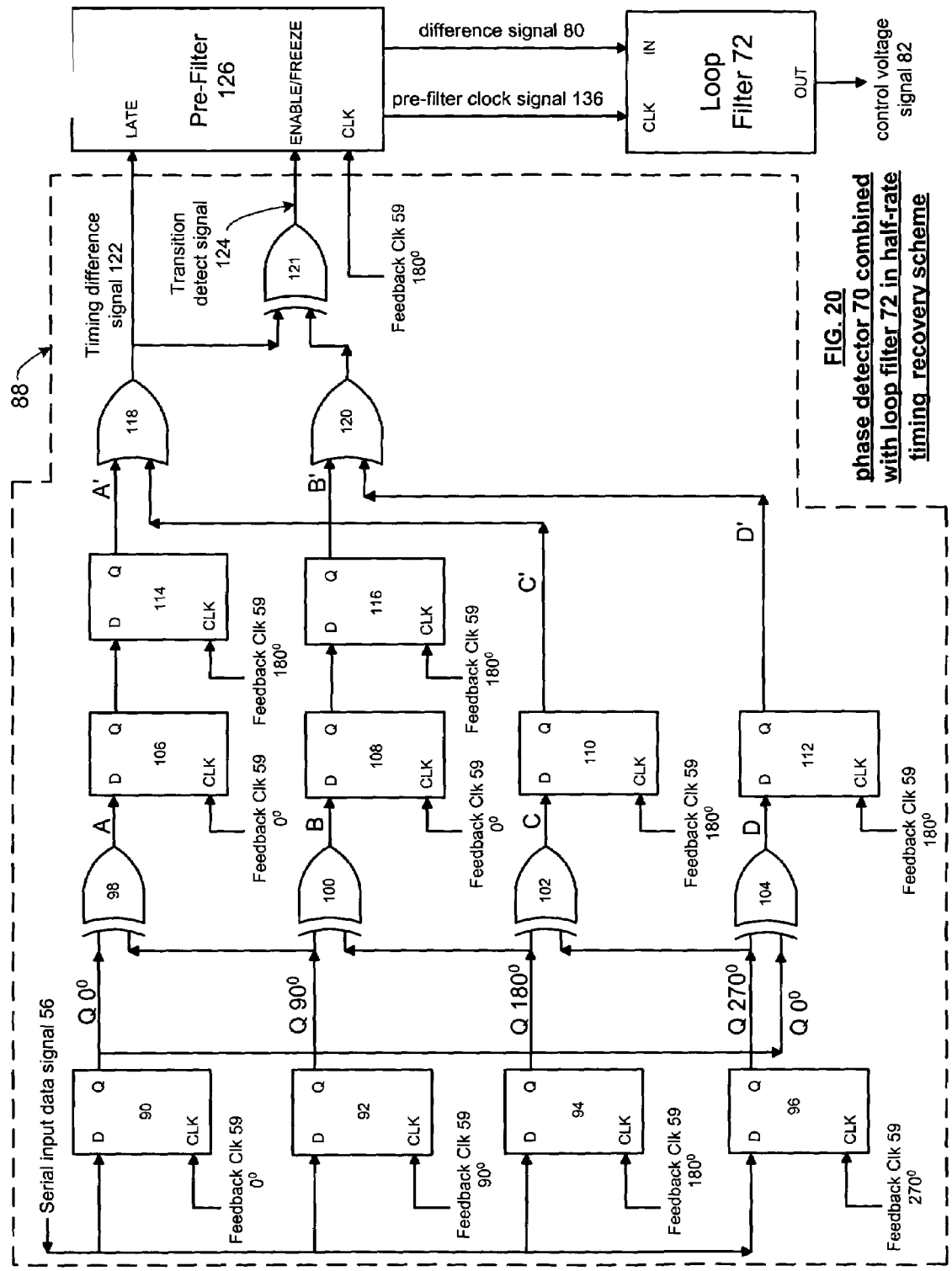

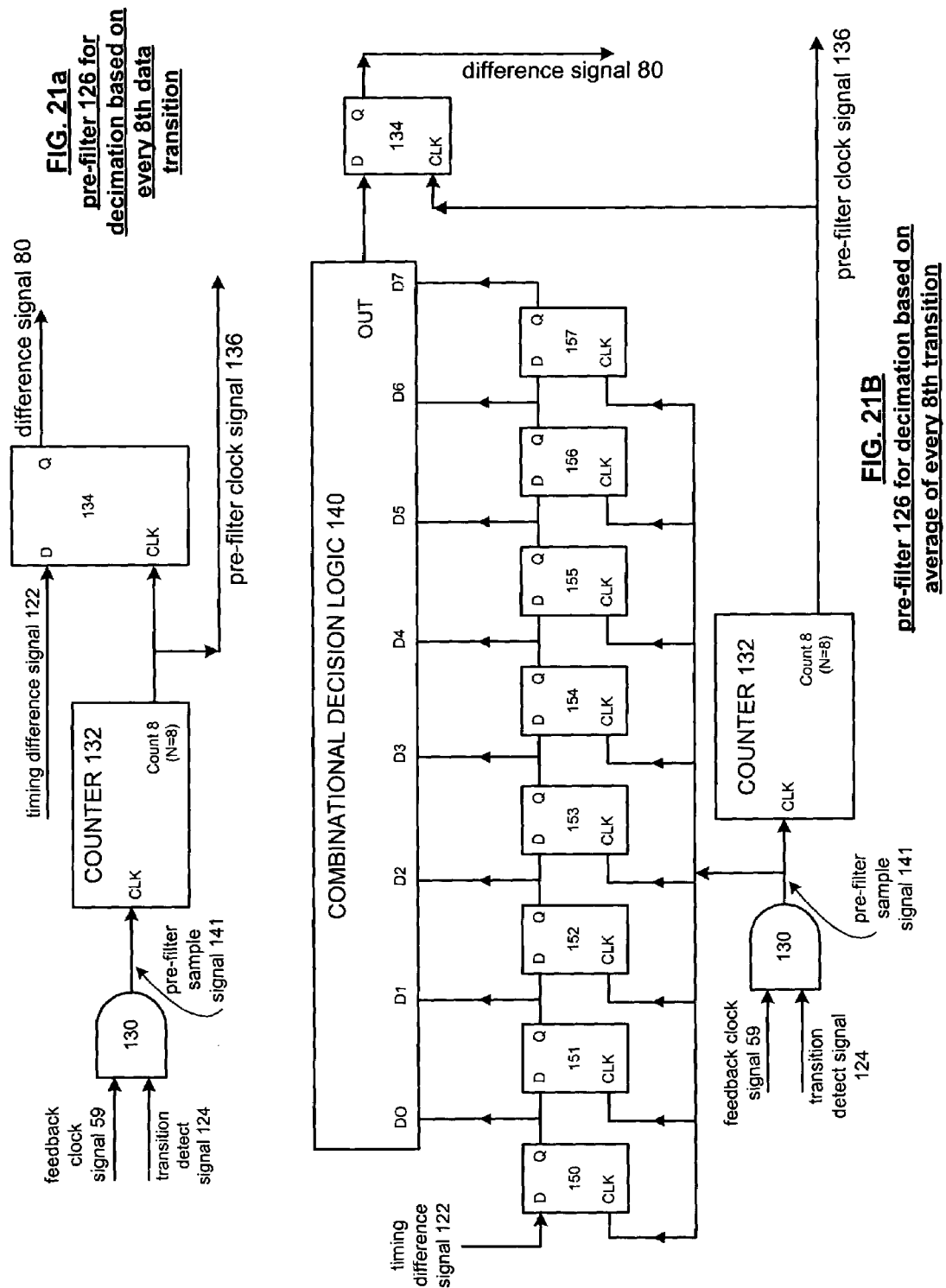

timing Diagram for phase detector 70 decimator output for decimation based on every nth transition, n=8 apparatus 190

TRANSITION INSENSITIVE TIMING RECOVERY METHOD AND APPARATUS

The present application claims priority under 35 U.S.C. 119(e) to the following patent application having the same title, a provisional Ser. No. of 60/401,792, and a provisional filing date of Aug. 7, 2002.

TECHNICAL FIELD OF THE INVENTION

This invention relates generally to data communications and more particularly to data recovery within such communication systems.

BACKGROUND OF THE INVENTION

In general, broadband communications are high-speed (e.g., greater than 45 megabits-per-second) data transmissions within a wide area network (WAN). Although typically broadband communication systems are fiber optic in nature, other media, such as coax cables, twisted pairs and serial backplanes are sometimes used. For example, many broadband networks include fiber optic interfaces that are constructed in accordance with the SONET (Synchronous Optical NETwork) standard. As is known, SONET is an optical interface standard that allows internetworking of transmission products from multiple vendors and prescribed transmission rates from 51.84 megabits-per-second to over 10 gigabits-per-second.

Other standards and protocols employing switching techniques that can vastly differ from the SONET standard are also known. For example, serial backplanes are not regulated by any standard, resulting in the existence of many proprietary signaling/switching schemes to improve the performance and costs of serial backplane systems. Further, timing recovery circuits are typically not protocol agnostic and rely on transition density to solve the problem of timing recovery. The reliance on transition density of prior art timing recovery circuits can lead to improper data sampling because of timing inaccuracy resulting from drifting and loss of synchronization due to low update rates during transitionless data periods.

As is also known, data transmissions via fiber optic and other data links are serial streams of data, but within a network component (e.g., switch, relay, bridge, gateway, et cetera) the data is processed in parallel. As such, each network component typically includes a serializer-deserializer transceiver (i.e., transmitter and receiver). In general, the transmitter converts parallel data into serial data and sources the serial data onto a fiber optic link. A receiver receives serial data via a fiber optic link and converts it back into parallel data.

A critical function of the receiver is to sample accurately the received serial data to be able to produce the parallel data. While the data rates for, for example, fiber optic transmissions are specified, and hence the required clock signals are specified, the clocks of the transceivers are not synchronized. Thus, the phase and/or frequency of the transmitter sourcing the received serial data may not align with the clock signal of the receiver. Such a misalignment, if uncorrected, can produce errors in the resulting parallel data. To correct the misalignment, receivers include a data and clock recovery circuit.

In general, timing recovery circuits and methods can be divided into two categories: phase-locked loop (PLL) architecture based timing recovery, and delay-locked loop (DLL) architecture based timing recovery. FIGS. 1 and 2, respectively, are block diagrams of PLL and DLL based timing recovery circuits that are widely used in various types of communication systems, including fiber optic networks.

As shown in FIG. 1, the PLL based timing recovery scheme can employ a data-driven phase detector, a loop filter, a voltage controlled oscillator (VCO), and an optional divider module. The data-driven phase detector produces an output signal that is a measure of the phase/timing difference of its inputs: a data input signal and a feedback clock. The output of the phase detector is filtered through the loop filter to generate a control voltage for the voltage controlled oscillator (VCO). The VCO is a controlled frequency source that produces an output oscillation based on the control voltage. The output oscillation can then be divided down by n (where n is any positive number) in the divider module to produce the feedback clock signal. The rate of the output oscillation is based on the divider module value such that if the divider module value is one, then the rate of the output oscillation is equal to the rate of the data input signal, and if the divider module value is two, the rate of the output oscillation is twice that of the data input signal, etc. As will be appreciated by one of average skill in the art, an auxiliary frequency acquisition loop can be used to aid the VCO in pulling close to the data rate. For example, the feedback clock signal, synchronized with the timing of the data input signal, can be used to retime the data input signal for processing and switching as needed in a communications system implementing the timing recovery scheme.

In the DLL based timing recovery scheme of FIG. 2, a delay cell replaces the VCO of FIG. 1. The delay cell introduces an adjustable delay to its input reference clock by means of the control voltage signal. A conceptual diagram of a delay cell based on phase interpolation, as known to those familiar with the art, is shown in FIG. 3.

As shown in FIG. 3, a phase interpolator employs several fixed clock phases (e.g., 0°, 90°, 180°, 270°) to create an adjustable phase. For example, the phase interpolator can produce 16 phases of a reference clock with steps corresponding to 360° divided by 16. The selection of a particular phase is based on the enablement of switches D0–D15. As is also shown, each switch controls a current source that when enabled couples the current source to the output (e.g., the recovered clock signal) via a transistor. For example, if the desired phasing of the recovered clock signal is 0°, switches D0–D3 are enabled and the remaining switches are disabled. For a phase shift of 360° divided by 16, switches D1–D4 are enabled while D0 and D5–D15 are disabled. Accordingly, each phase step is achieved by enabling various combinations of the switches.

In both PLL and DLL based timing recovery systems, the accuracy and timeliness of the phase detector output plays a significant role in performance. Because both PLL and DLL based timing recovery circuits are closed loop feedback circuits, when the phase detector updates diminish (i.e., the data input is a relatively long string of zeros or ones), they tend to drift and lose the synchronization with the data input signal. In addition, drifting and loss of synchronization introduces jitter in the feedback clock signal which degrades the data retiming and causes bit errors. These transitionless, relatively long strings of zeros or ones, are of concern for both full-rate and half-rate timing recovery circuits. FIG. 4 illustrates examples of data and clock timing relationships for full-rate and half-rate timing recovery schemes.

FIG. 5 shows a schematic block diagram of a prior art half-rate binary type phase detector combined with a loop filter. As a result of sampling a data input signal with four equally spaced phases (e.g., 0, 90, 180 and 270 degrees) of the feedback clock, XOR (exclusive OR) outputs A, B, C and D indicate whether the feedback clock is late or early with respect to a desired sampling instant of the data input signal. The decision logic within the phase detector processes the XOR outputs to generate a valid late/early decision, which is used to update the timing recovery loop. A digital loop filter having high noise immunity can be used to filter the late/early signal, which is particularly advantageous in highly integrated systems. In addition, use of a digital loop filter eliminates bulky RC components, which can vary due to IC manufacturing process variations and temperature, allowing for the flexible and accurate realization of large time constants in a relatively small silicon area. Decimation (sub-sampling) is widely used in digital filters to adjust the corner frequency of the filters and obtain large time constants.

The phase detector XOR outputs produce a late/early decision on every feedback clock period, while the digital loop filter accepts a decision on every Mth period of a reference clock. If the optional divider module previously discussed with respect to FIGS. 1 and 2 is a divide by 1 divider, the feedback clock and the reference clock will be the same frequency. As will be recognized by those skilled in the art, the low pass bandwidth of the timing recovery system should be decades smaller than the data rate of concern. Therefore, M values ranging from the 10's to 100's can be possible and may be required. As a result, long transitionless periods of the data input signal combined with large decimation by M in the digital loop filter cause update inaccuracies that degrade the timing recovery performance.

FIGS. 6 and 7 provide an example timing diagram and decision table, respectively, for the phase detector and digital loop filter timing recovery circuit of FIG. 5. FIG. 8 shows a block diagram of a prior art implementation of the decision logic for the same circuit. FIGS. 9a and 9b, respectively, depict a current mode logic (CML) structure for an XOR gate as a transistor-level schematic and as a conceptual symbol. The CML structure XOR gate of FIGS. 9a and 9b is used in FIG. 10, which provides a schematic block diagram of an analog implementation of the decision logic of the phase detector of FIG. 5 combined with a digital loop filter. During long transitionless periods of the data input signal, the analog implementation of FIG. 10 suffers various problems, including leakage through the RC components, comparator offset and improper sampling due to timing inaccuracy. FIG. 11 illustrates the comparator input node signals during a long transitionless period for the analog implementation timing recovery circuit of FIG. 10.

During high transition density periods, large RC time constants decrease the effect of comparator offset and improper sampling instances because they average toward the correct direction for phase alignment among many decisions per every transition. This is because a few inaccurate decisions among many decisions cannot have a significant impact. FIG. 12 is a timing diagram illustrating the latency and inaccuracy introduced due to the comparator offset for the analog implementation of FIG. 10.

Another problem associated with the prior art timing recovery circuit of FIG. 10 is the inability to determine whether a valid data transition has occurred. This can cause incorrect decisions at the comparator output when there is no transition, resulting in drift of the clock and data alignment. As an improvement to the analog implementation of FIG. 10, another comparator can be used to flag the data input signal transitions by means of a transition detect signal. FIG. 13 is a schematic block diagram of an analog implementation of a phase detector decision logic incorporating a second comparator for detecting data input signal transitions. FIG. 14 illustrates an example timing diagram for the phase detector of FIG. 13. This phase detector can be thought of as a 3-state phase detector where "late", "early", and "no transition" are the states and the "late/early" and "transition" output signals are used to switch between the states.

The prior art phase detector of FIG. 13, however, can still fail to detect single transitions between long transitionless periods of the data input signal due to comparator offset and improper sampling instants. FIG. 15 illustrates another example timing diagram for the phase detector of FIG. 13 illustrating that due to phase differences between the feedback clock and the reference clock, late/early signal pulses and transition output signal pulses can be missed. Comparator offsets can further shrink the pulse width of the late/early signal and the transition output signal. Failure to detect a single isolated data input signal transition could be a fatal problem for a timing recovery circuit.

Instead of using a divide by M version of the reference clock, the reference clock itself could be used to sample the phase detector output, and loop update can be achieved at almost the same rate of the feedback clock. As will be realized by one of average skill in the art, however, this will not eliminate the problem associated with an isolated single data transition, because unknown phase differences between the feedback clock and the reference clock still exist. Further, such a design would require supplying significantly more power to the digital loop filter due to increased operating frequency.

Therefore, a need exists for a data and clock recovery circuit for use in digital communication systems that can reduce or eliminate these problems of the prior art.

BRIEF SUMMARY OF THE INVENTION

The timing recovery circuit and applications thereof of the present invention substantially meet these needs and others. An embodiment of the timing recovery circuit comprises a data-driven phase detector and a digital loop filter. The data-driven phase detector is operably coupled to determine at least a phase difference between an input signal and a feedback clock signal to produce a difference signal. Determining the phase difference can comprise digitally determining a timing difference between the input signal and the feedback clock signal, digitally determining a transition of the input signal to produce a transition detect signal, and digitally updating the timing difference based on the transition detect signal and the feedback clock signal. The timing difference can be digitally updated by pre-filtering the timing difference at a digital pre-filter, based on a pre-filter clock signal produced from the transition detect signal and the feedback clock signal, to produce the difference signal. The loop filter is operably coupled to digitally filter the difference signal based on the transition detect signal and the feedback clock signal to produce a control voltage.

The timing recovery circuit of this invention can be implemented as a PLL-based timing recovery circuit or as a DLL-based timing recovery circuit. A PLL-based embodiment of the timing recovery circuit can further comprise a voltage controlled frequency source operably coupled to generate a recovered clock based on the control voltage, and a divider module operably coupled to divide the recovered clock to update the feedback clock signal. A DLL-based embodiment of the timing recovery circuit can further comprise a delay cell operably coupled to delay a reference clock based on the control voltage to generate a recovered clock, and a divider module operably coupled to divide the recovered clock to update the feedback clock signal. The various embodiments of the data recovery circuit of this invention can be incorporated in an optical receiver.

BRIEF DESCRIPTION OF THE SEVERAL VIEWS OF THE DRAWINGS

FIG. 7 is an exemplary decision table for the phase detector of FIG. 5;

FIG. 20 is a schematic block diagram of a digital implementation of a phase detector and loop filter in accordance with the present invention;

FIG. 21a is a schematic block diagram of one embodiment of a pre-filter for decimation based on every nth transition in accordance with the present invention, for the case where n=8;

FIG. 21b is a schematic block diagram of an embodiment of a pre-filter for decimation based on taking the average of every n transitions in accordance with the present invention;

FIG. 23 illustrates a timing diagram for a pre-filter in accordance with the embodiment of FIG. 21a.

DETAILED DESCRIPTION OF THE INVENTION

The various embodiments of the timing recovery circuit of the present invention can comprise a data-driven phase detector and a digital loop filter combination that incorporates loop updates based on decisions in synchronous with a recovered clock. Embodiments of this invention can be implemented as a method for high-speed timing recovery using a DLL or PLL-based architecture and can provide for accurate lock and tracking of data transitions in a low transition density environment or in the case of an isolated transition between transitionless periods of an input data signal.

Figure 1:
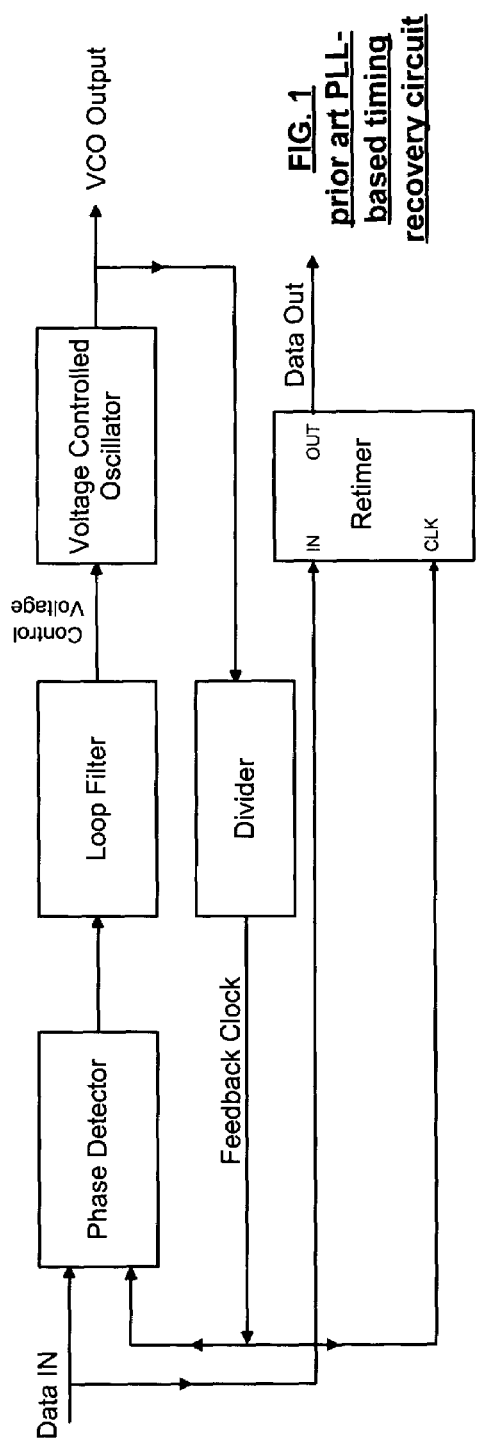
FIG. 1 is a schematic block diagram of a prior art PLL-based timing recovery circuit.
Figure 2:
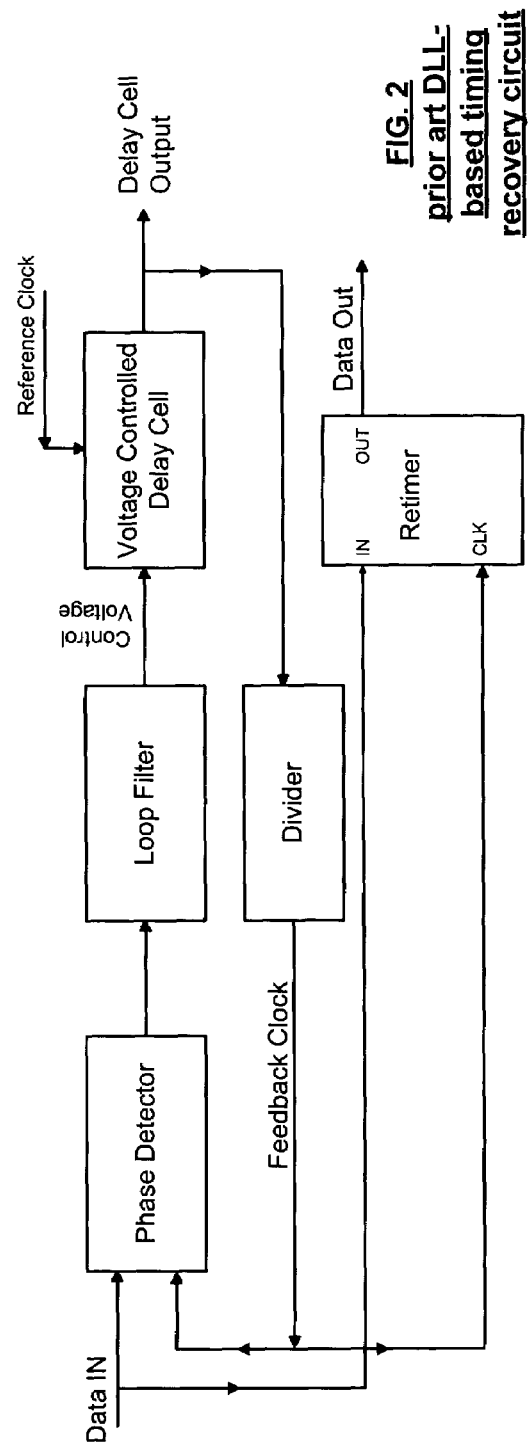
FIG. 2 is a schematic block diagram of a prior art DLL-based timing recovery circuit.
Figure 3:
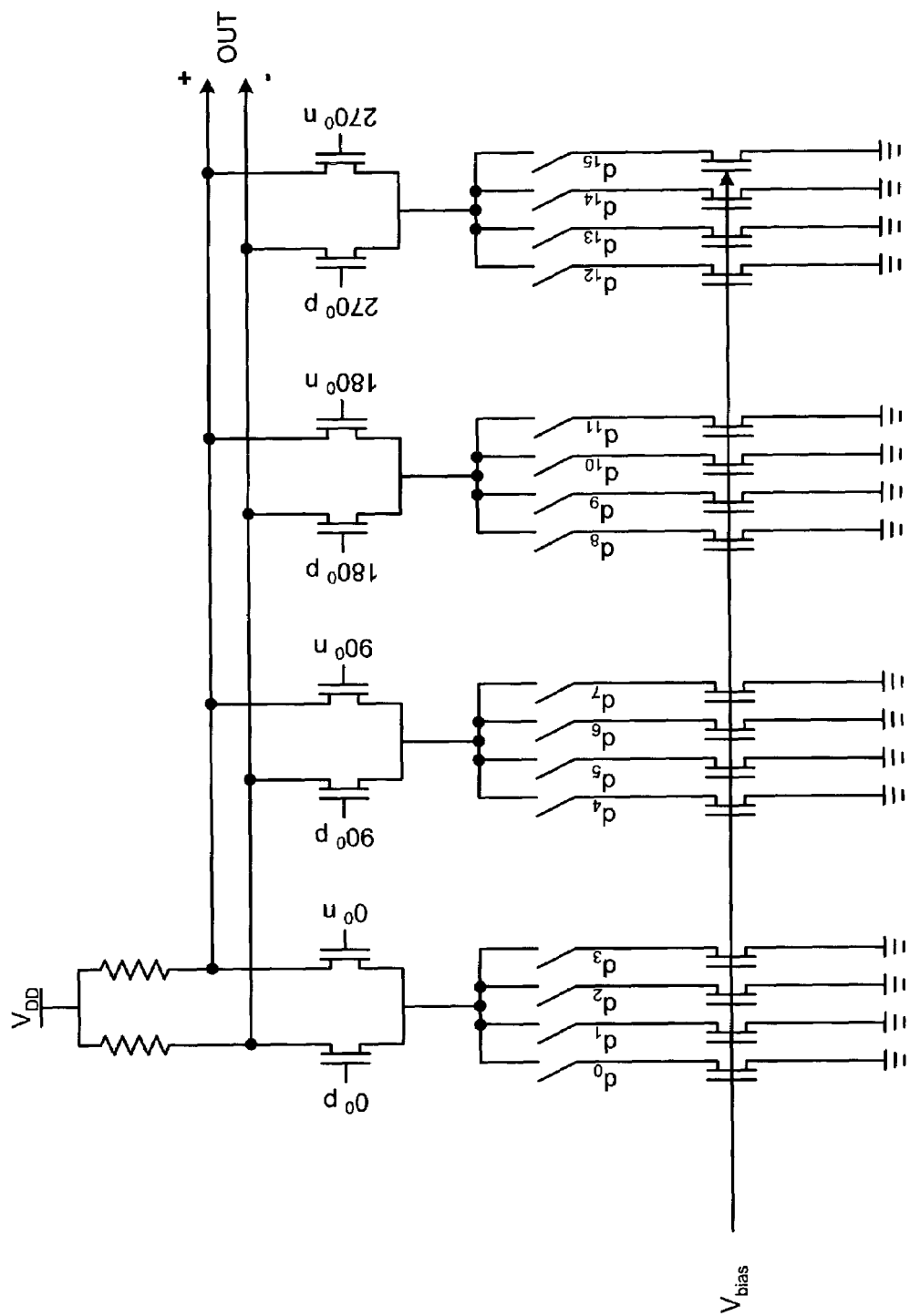
FIG. 3 is a conceptual block diagram of an example prior art delay cell based on phase interpolation.
Figure 4:
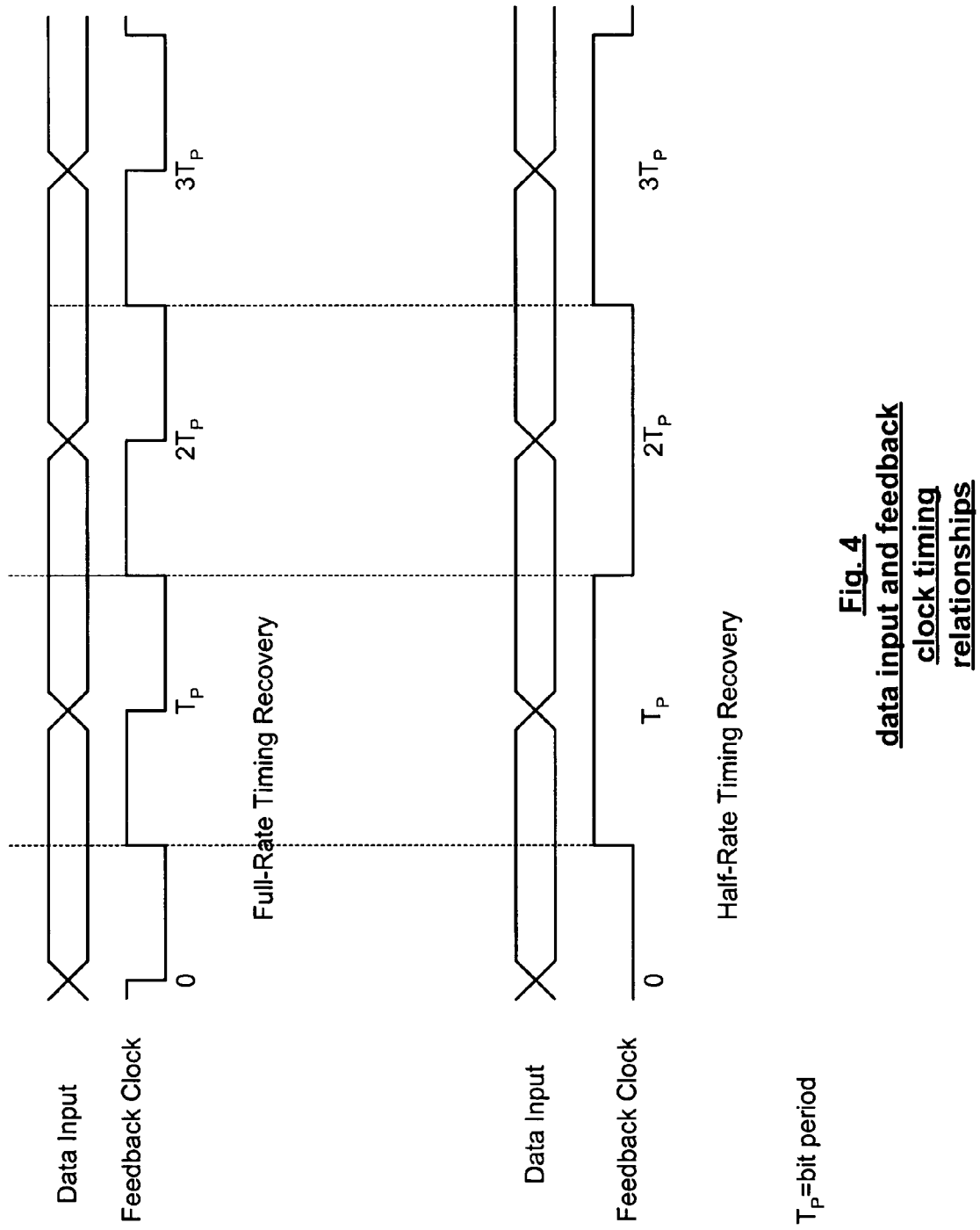
FIG. 4 is a timing diagram illustrating exemplary data and clock timing relationships for a full-rate and half-rate timing recovery scheme.
Figure 5:
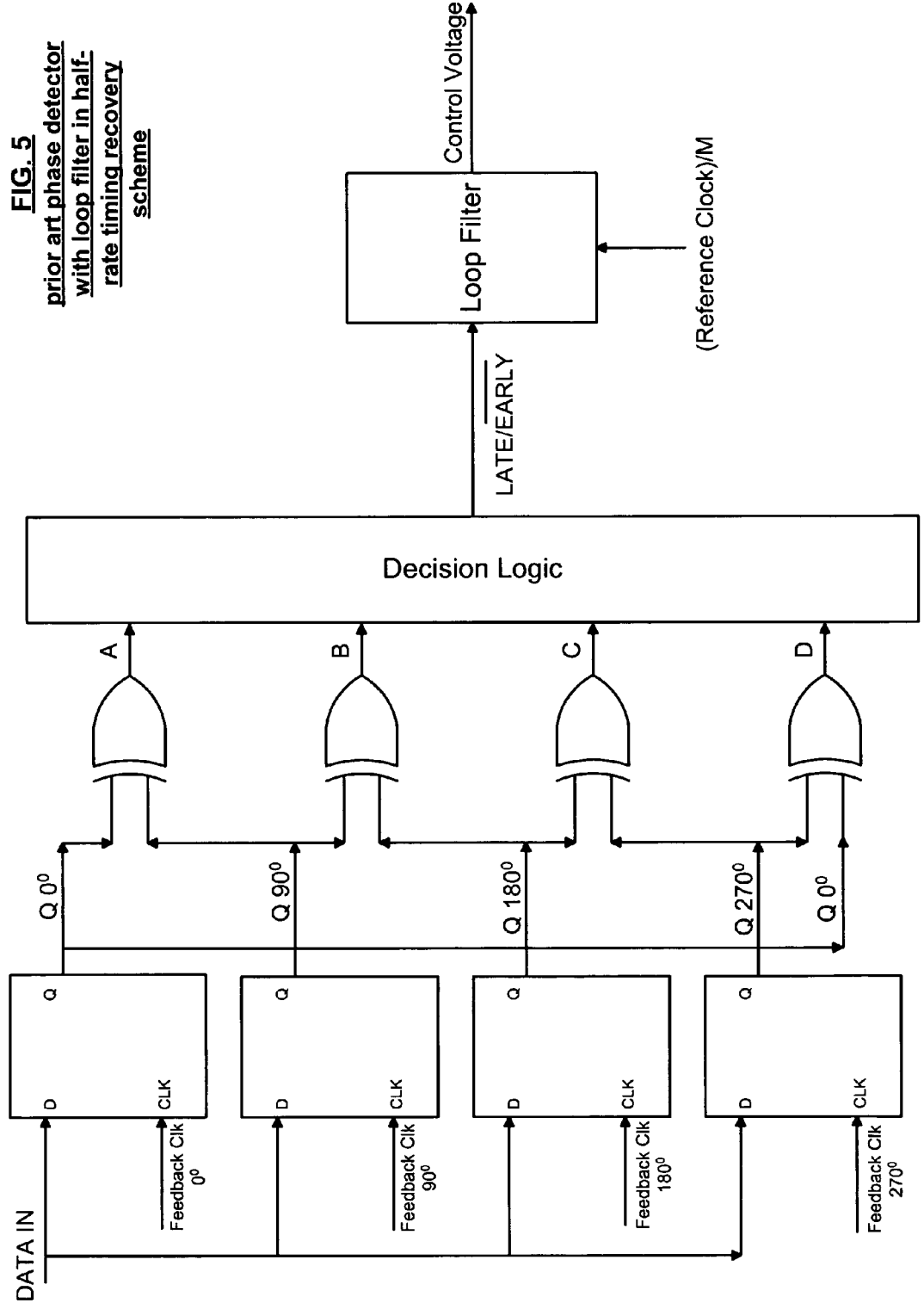
FIG. 5 is a schematic block diagram of a prior art half-rate binary type phase detector.
Figure 6:
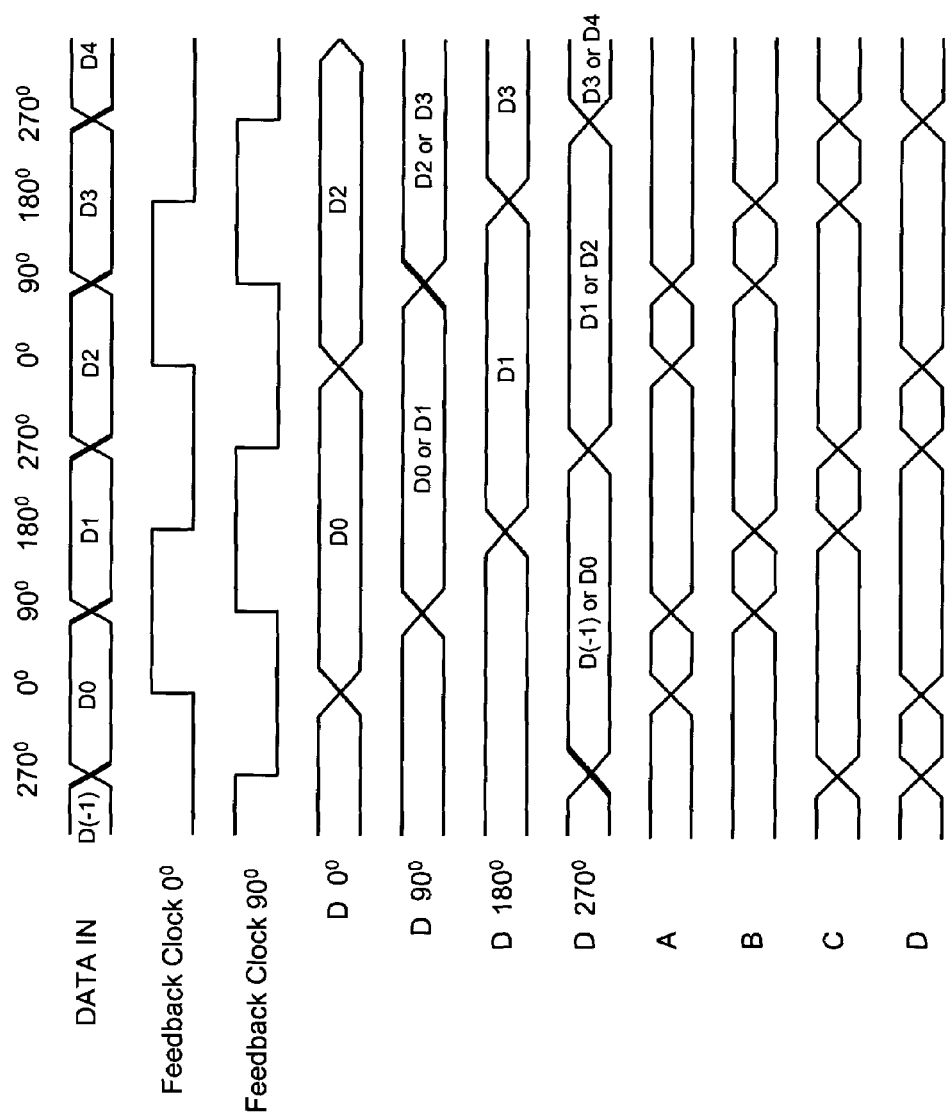
FIG. 6 is an exemplary timing diagram for the phase detector of FIG. 5.
Figure 8:
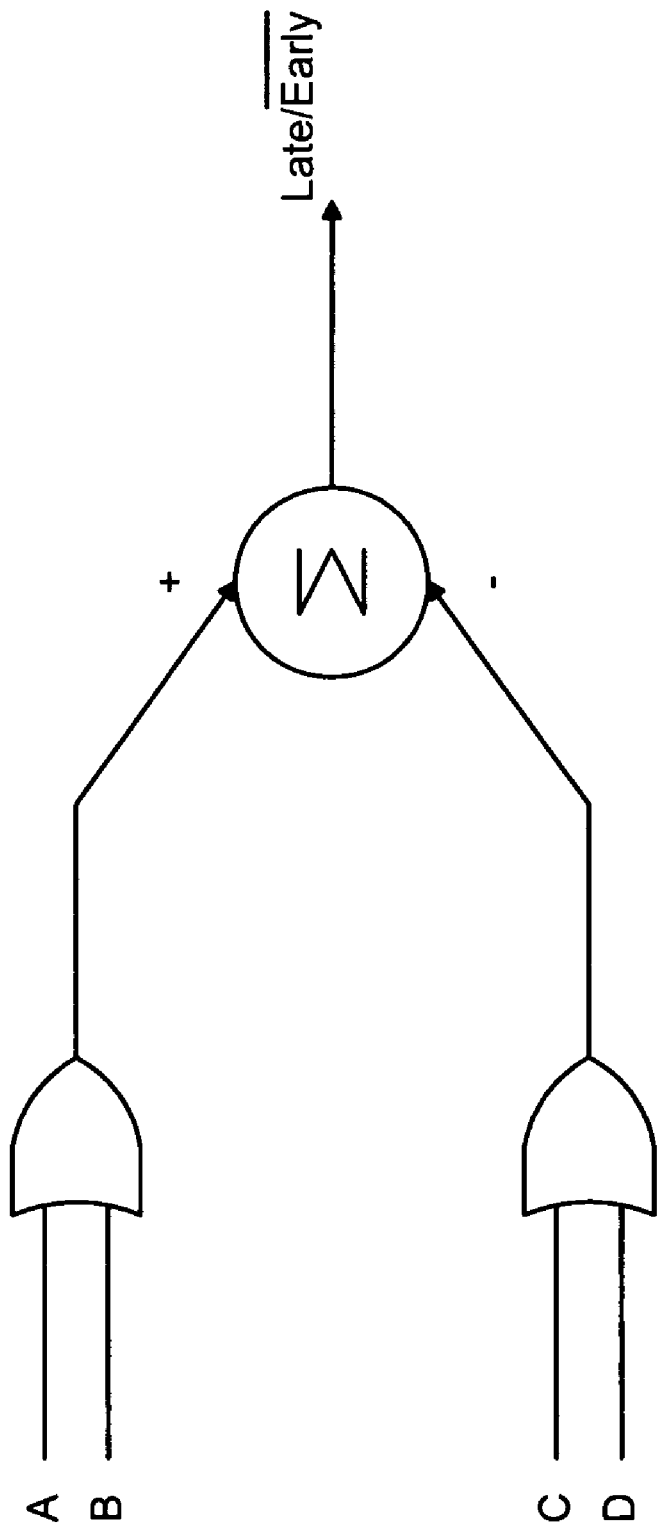
FIG. 8 is a conceptual block diagram of a prior art implementation of the decision logic for the phase detector of FIG. 5.
Figure 9A:
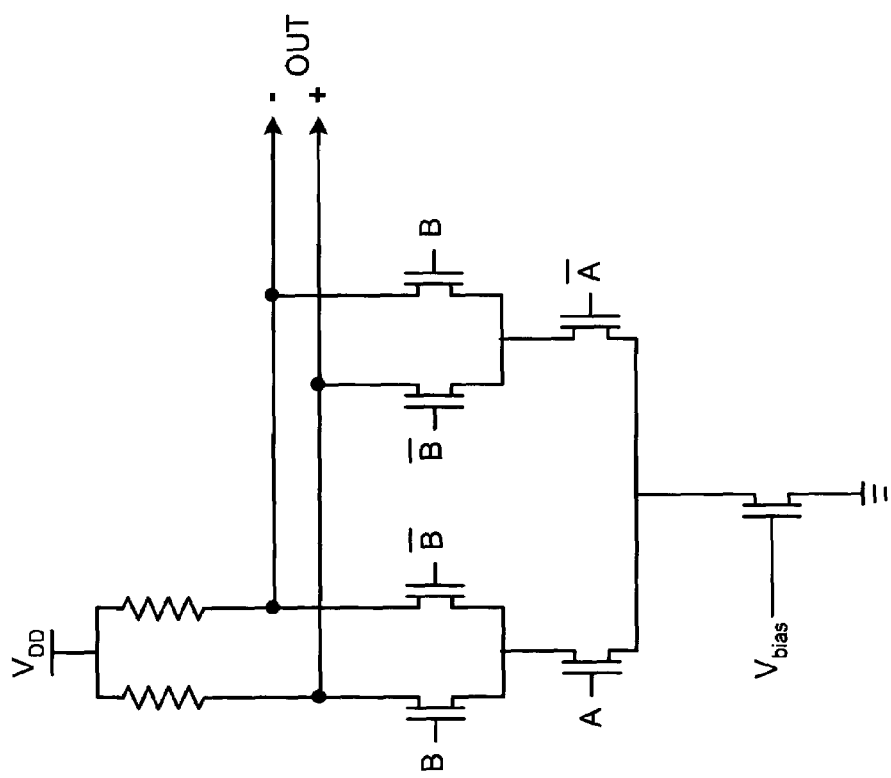
FIGS. 9a and 9b depict a current mode logic structure for an XOR gate as a transistor-level schematic and as a conceptual symbol, respectively.
Figure 9B:
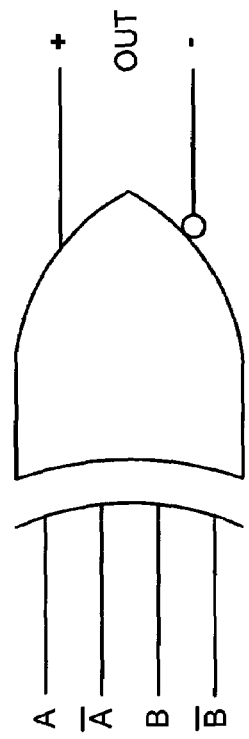
Figure 10:
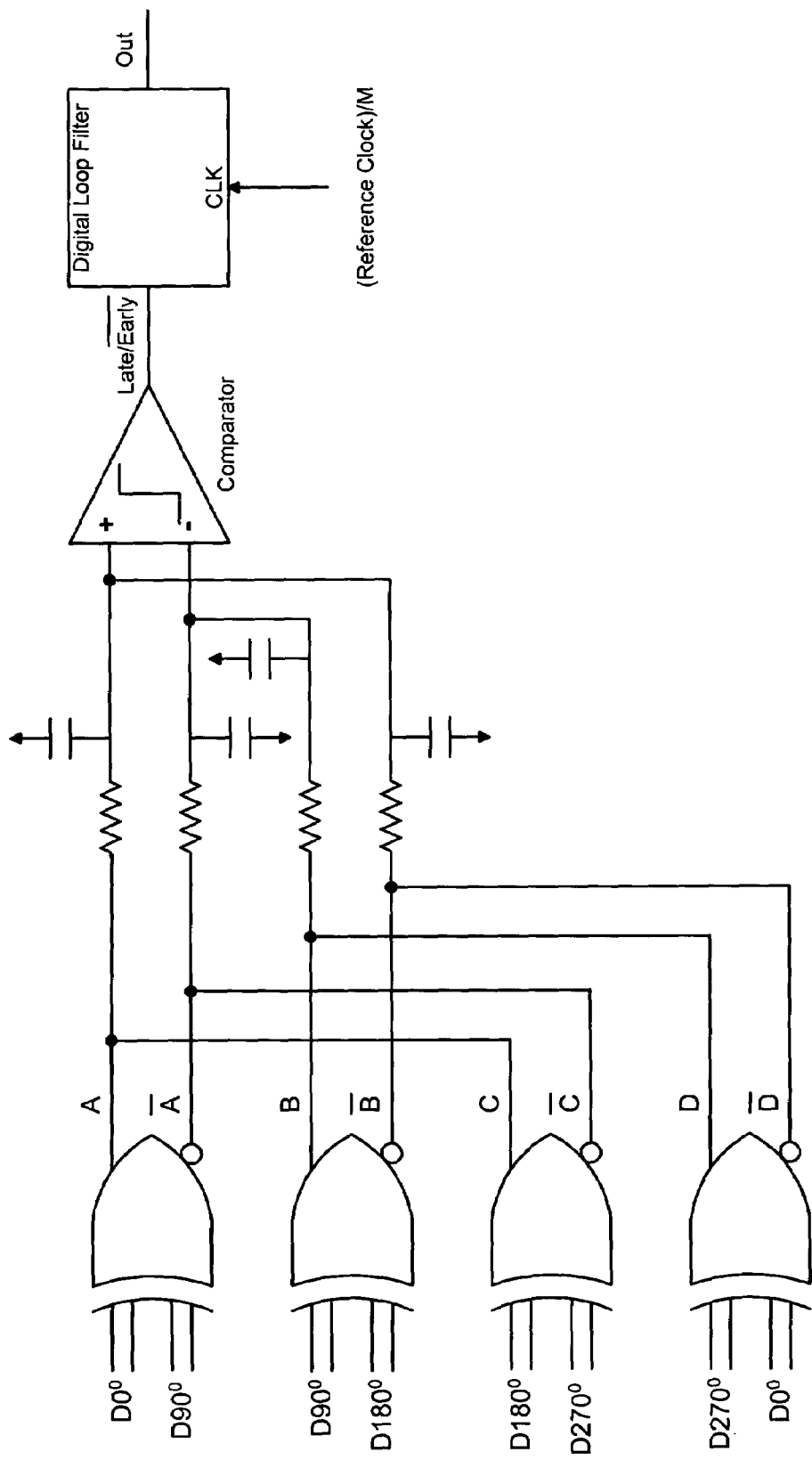
FIG. 10 is a schematic block diagram of an analog implementation of the decision logic for the phase detector of FIG. 5 combined with a digital loop filter.
Figure 11:
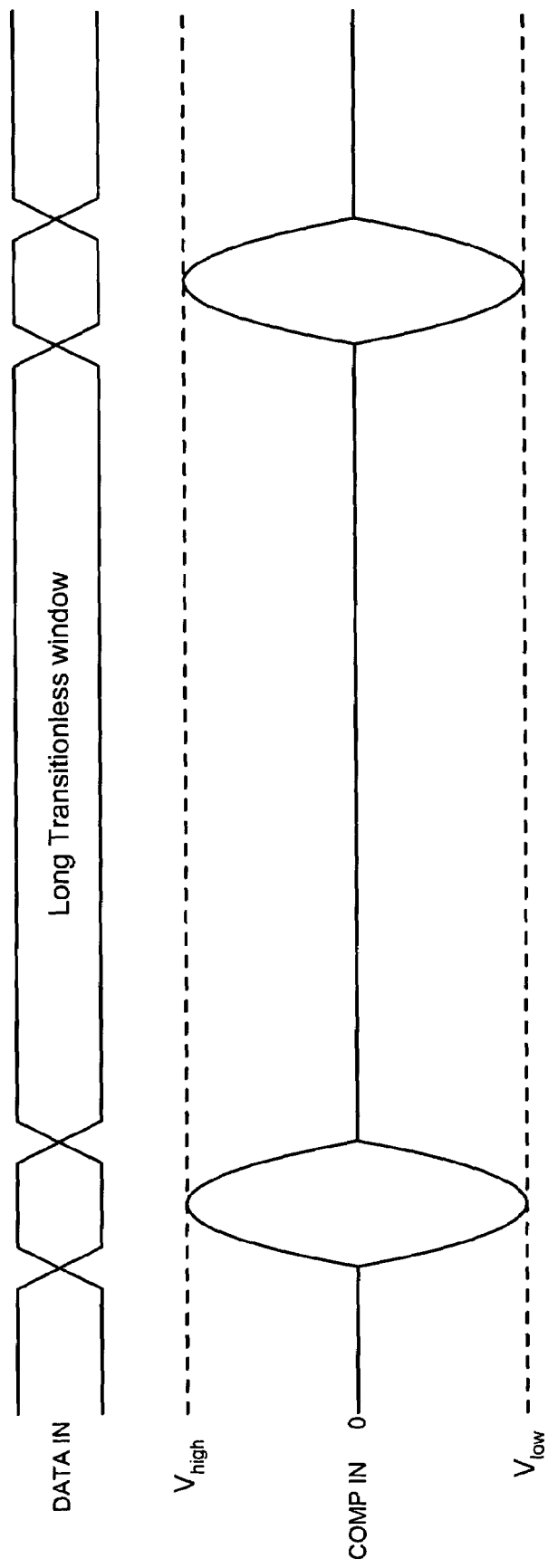
FIG. 11 illustrates the comparator input node signals during a long transitionless period for the analog implementation timing recovery circuit of FIG. 10.
Figure 12:
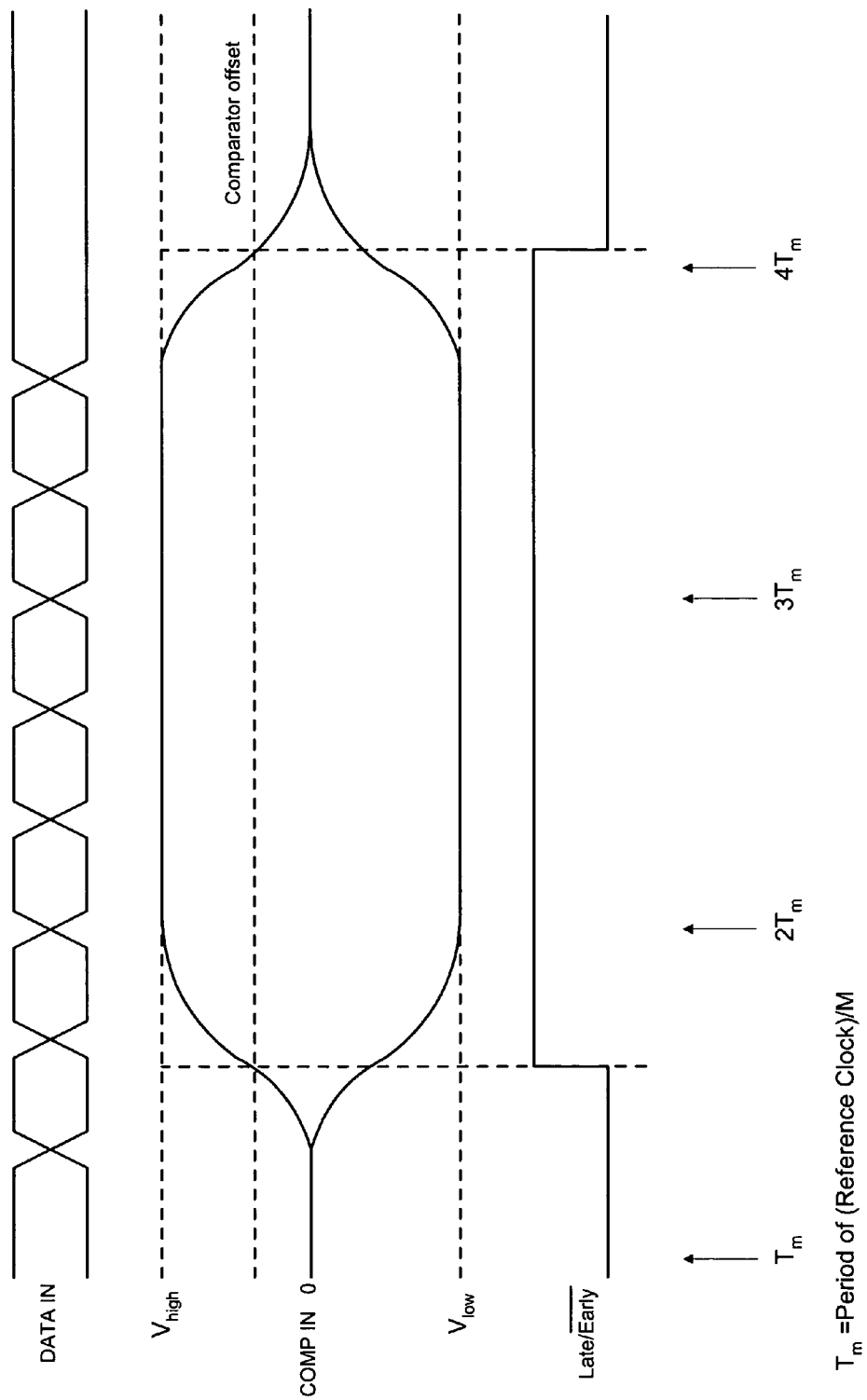
FIG. 12 is a timing diagram illustrating the latency and inaccuracy introduced due to the comparator offset for the analog implementation of FIG. 10.
Figure 13:
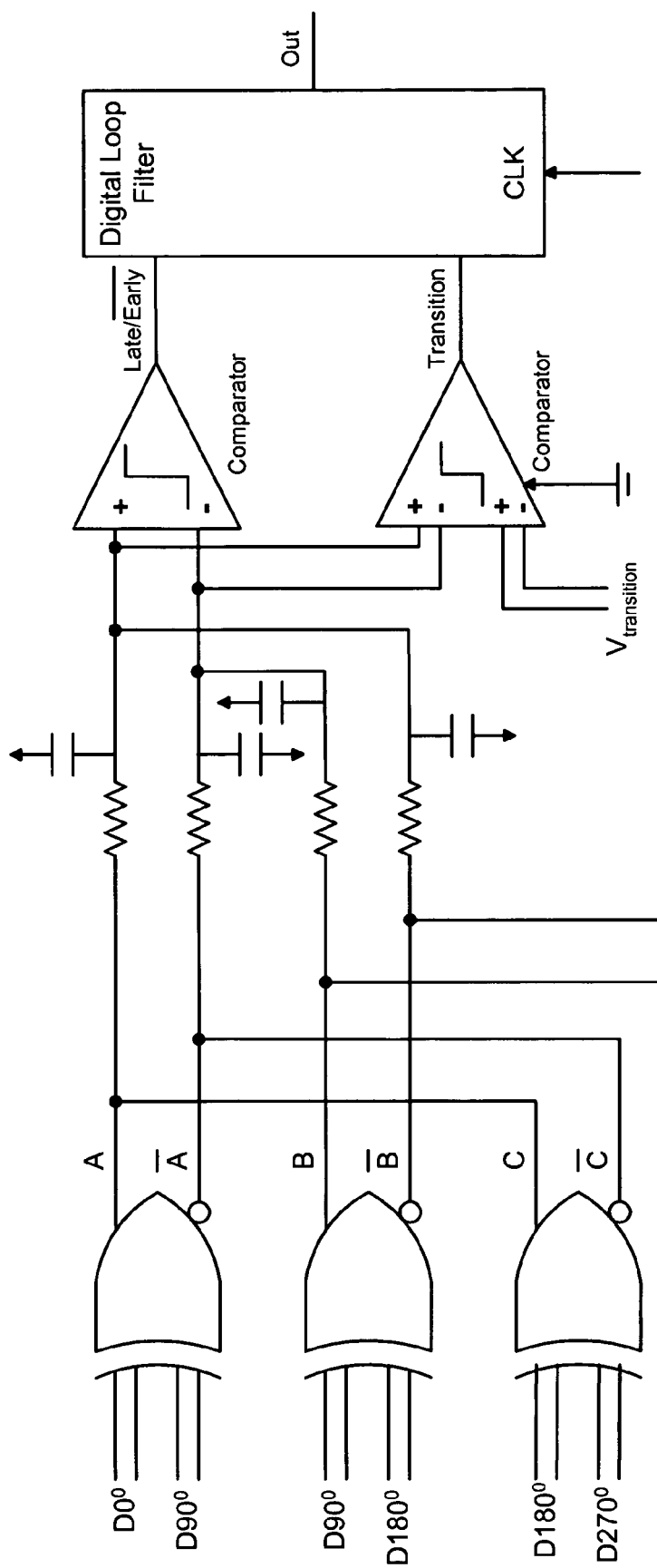
FIG. 13 is a schematic block diagram of an analog implementation of a prior art phase detector decision logic incorporating a second comparator for transition detection.
Figure 14:
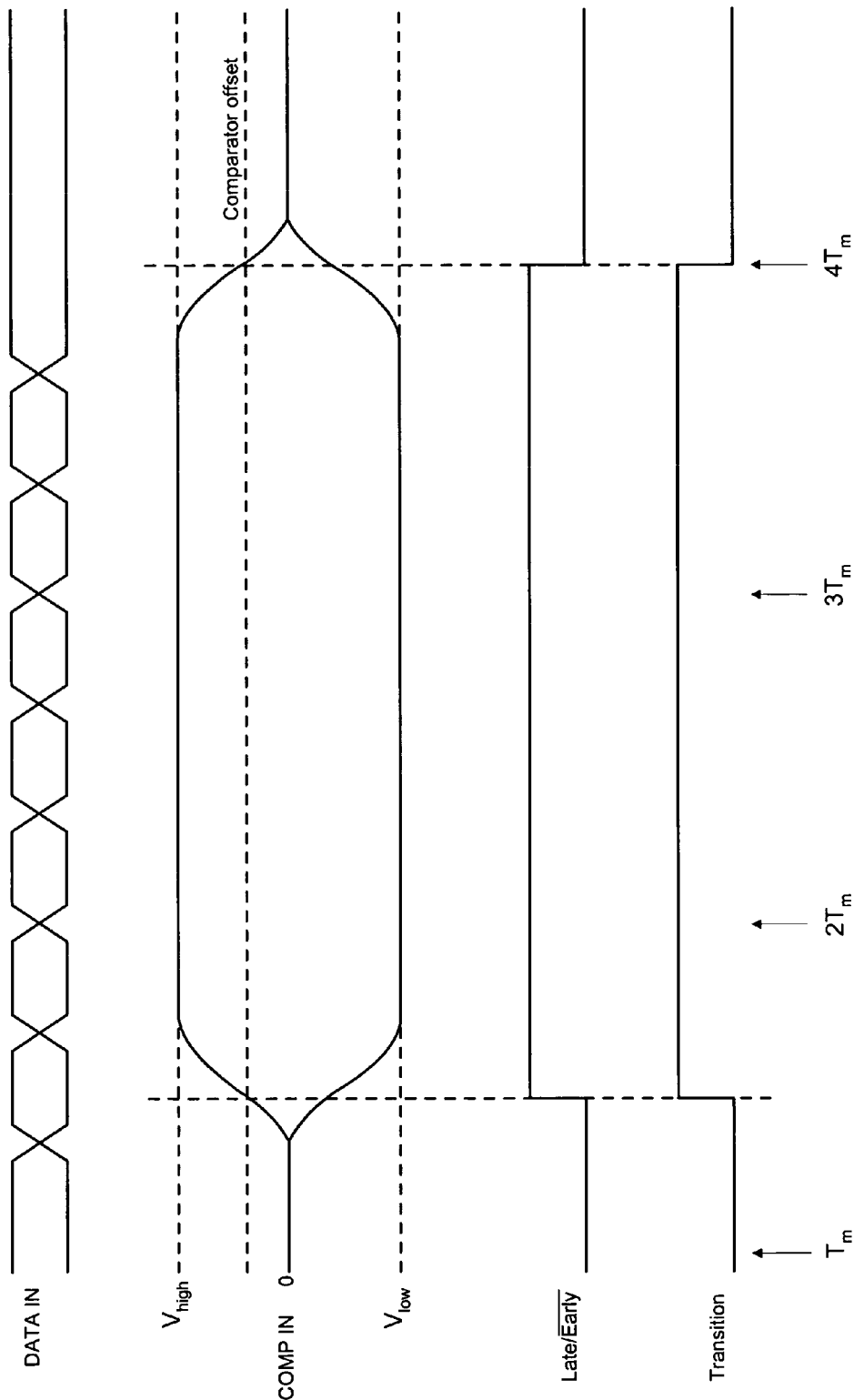
FIG. 14 provides an exemplary timing diagram for the phase detector of FIG. 13 in a high transition density situation.
Figure 15:
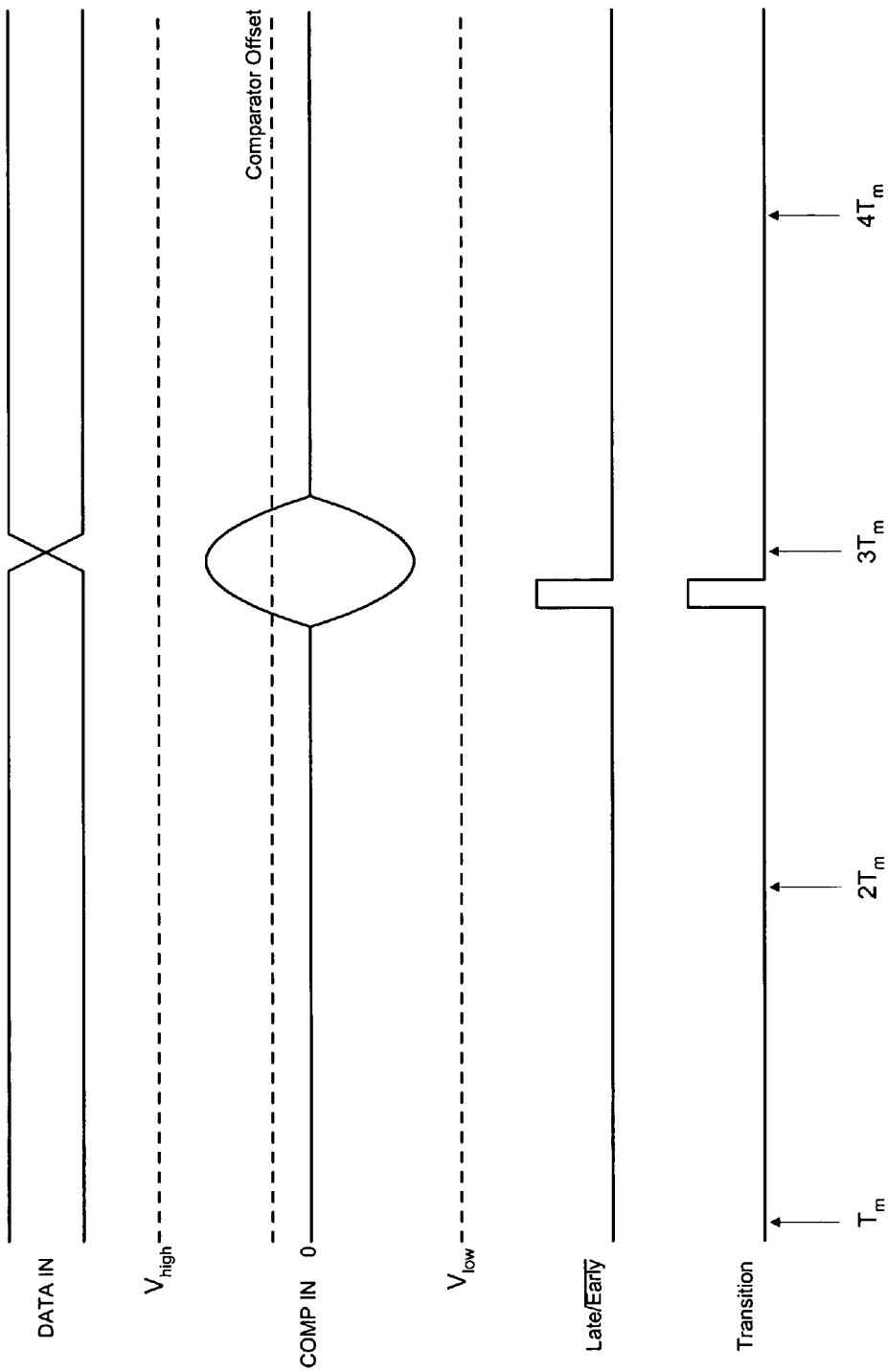
FIG. 15 provides another exemplary timing diagram for the phase detector of FIG. 13 in the case of a single isolated transition.
Figure 16:
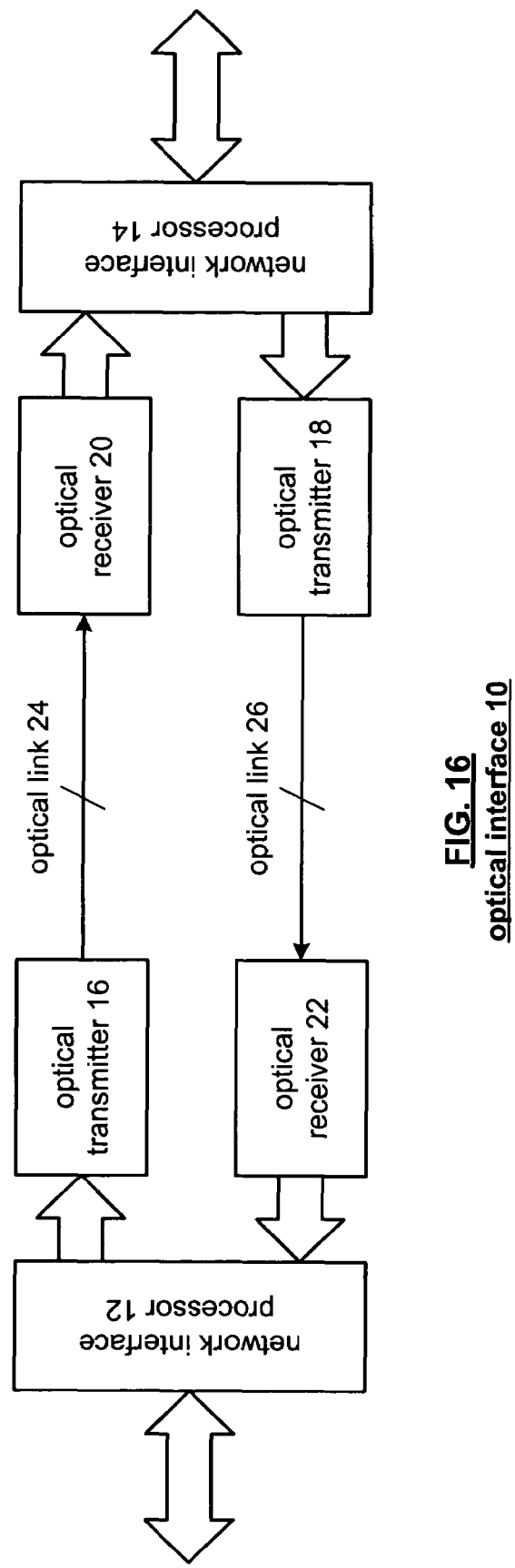
FIG. 16 is a schematic block diagram of an optical interface in accordance with the present invention.

FIG. 16 is a schematic block diagram of an optical interface 10 that includes network interface processors 12 and 14, optical transmitters 16 and 18, optical receivers 20 and 22 and optical links 24 and 26. Each optical link 24 and 26 may support one or more serial data streams at a rate specified by SONET or other communication standard. Accordingly, the concepts of the present invention are equally applicable in an optical communication system or in serial backplane communication systems, as well as in any digital communication system.

In general, data is transceived via the network interface processors 12 and 14, which may be included in a network component such as a switch, a bridge, a relay, a router, and/or any other type of network component used in fiber optic networks, the Internet, public switch telephone network, and/or any other wide area network or local area network. As shown, the data provided by network interface processor 12 to optical transmitter 16 is in a parallel format. The optical transmitter 16 converts the parallel data into serial data and transmits the serial data via optical link 24. Optical receiver 20 receives the serial data and converts it back into parallel data, which it then provides to network interface processor 14.

Similarly, network interface processor 14 provides parallel data to optical transmitter 18. Optical transmitter 18 converts the parallel data into serial data and communicates it via optical link 26 to optical receiver 22. Optical receiver 22 converts the serial data into parallel data and provides the parallel data to network interface processor 12.

As one of average skill in the art will appreciate, the optical interface 10 corresponds generally to any interface within any type of digital communication system that employs serial data transmission between devices. Accordingly, the optical links 24 and 26 may be replaced by radio frequency links, serial backplanes, microwave links, wires, et cetera. Accordingly, the concepts of the present invention are equally applicable in optical communication systems as well as in any other type of digital communication system.

Figure 17:
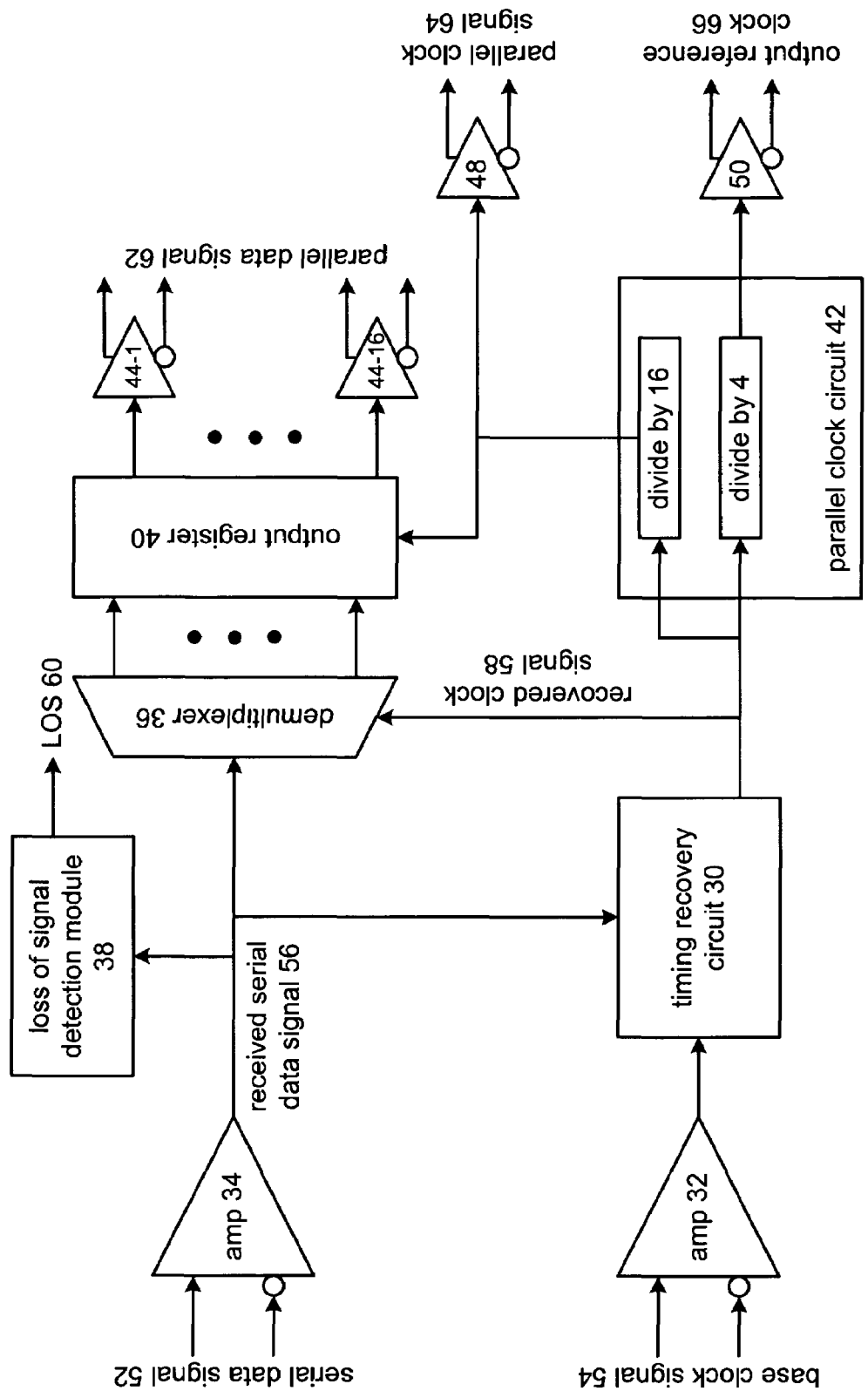
FIG. 17 is a schematic block diagram of an optical receiver in accordance with the present invention.

FIG. 17 is a schematic block diagram of optical receiver 20 or 22. As shown, the receiver 20 or 22 includes a timing recovery circuit 30, amplifiers 32 and 34, demultiplexor 36, loss of signal detection module 38, output register 40, parallel clock circuit 42 and a plurality of differential buffers 44–50. As shown, amplifier 32 is operably coupled to receive a differential base clock signal 54 and to provide it to the timing recovery circuit 30. Amplifier 34 receives a differential serial data signal 52 and provides it to the timing recovery circuit 30, to the loss of signal detection module 38, and to the demultiplexor 36 as the received serial input data signal 56. As one of average skill in the art will appreciate, the amplifiers 32 and 34 may process single-ended signals as well.

The loss of signal detection module 38 determines whether the received serial input data signal 56 is above a minimum signal strength threshold. If not, the loss of signal detection module 38 generates a loss of signal (LOS) indication 60. If the received input serial data signal 56 is above the minimum required signal strength, the recovery circuit 30 generates a recovered clock signal 58 therefrom.

Based on the recovered clock signal 58, demultiplexor 36 converts the received input serial data signal 56 into parallel data that is stored in output register 40. Buffers 44-1 through 44-16 buffer the output register 40 to provide the parallel data signal 62.

The parallel clock circuit 42 includes a divide by 16 module and may also include a divide by 4 module. The divide by 16 module receives the feedback clock signal 58 and produces a clock signal that is $\frac{1}{16}^{th}$ the frequency. This signal is provided to the output register 40 for clocking in the data produced by demultiplexor 36. Buffer 48 may provide a parallel clock signal 64 to devices outside of the optical receiver 20 or 22. Similarly, buffer 50 may provide a divide by 4 output reference clock 66 to devices outside the optical receiver 20.

Figure 18:
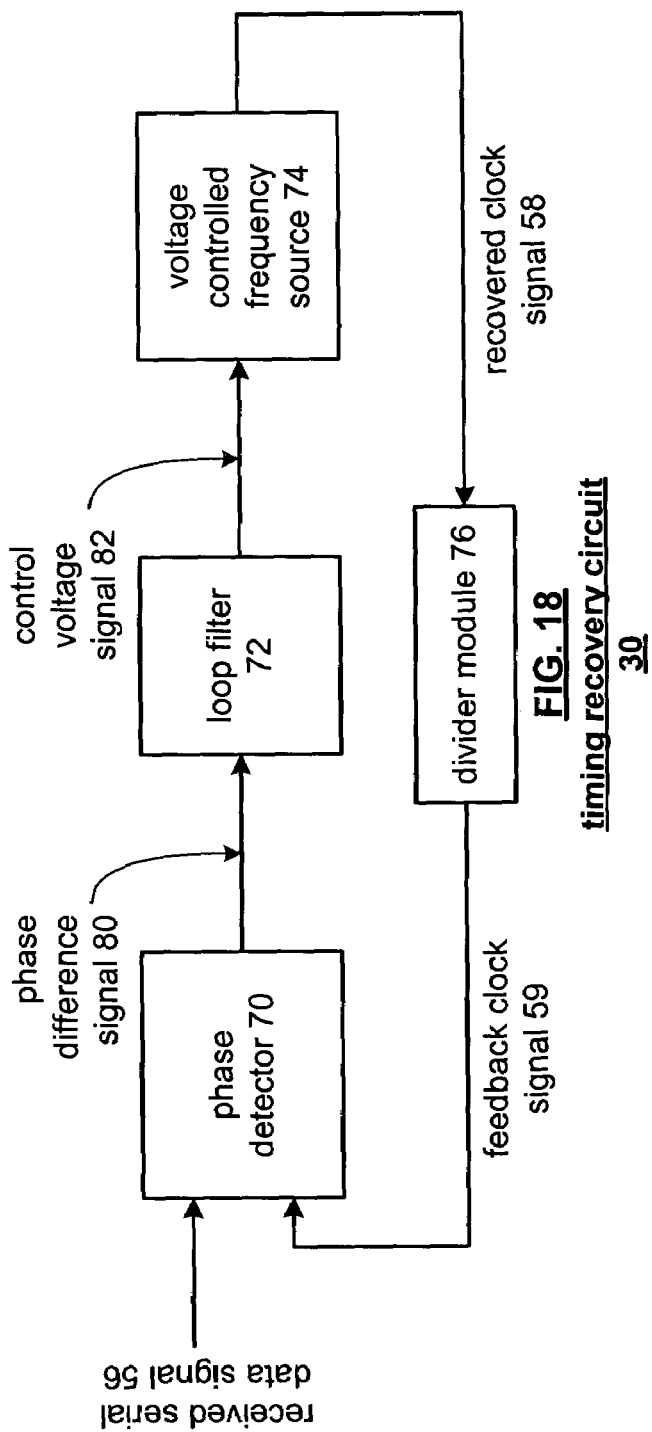
FIG. 18 is a schematic block diagram of a timing recovery circuit in accordance with the present invention.
Figure 18A:
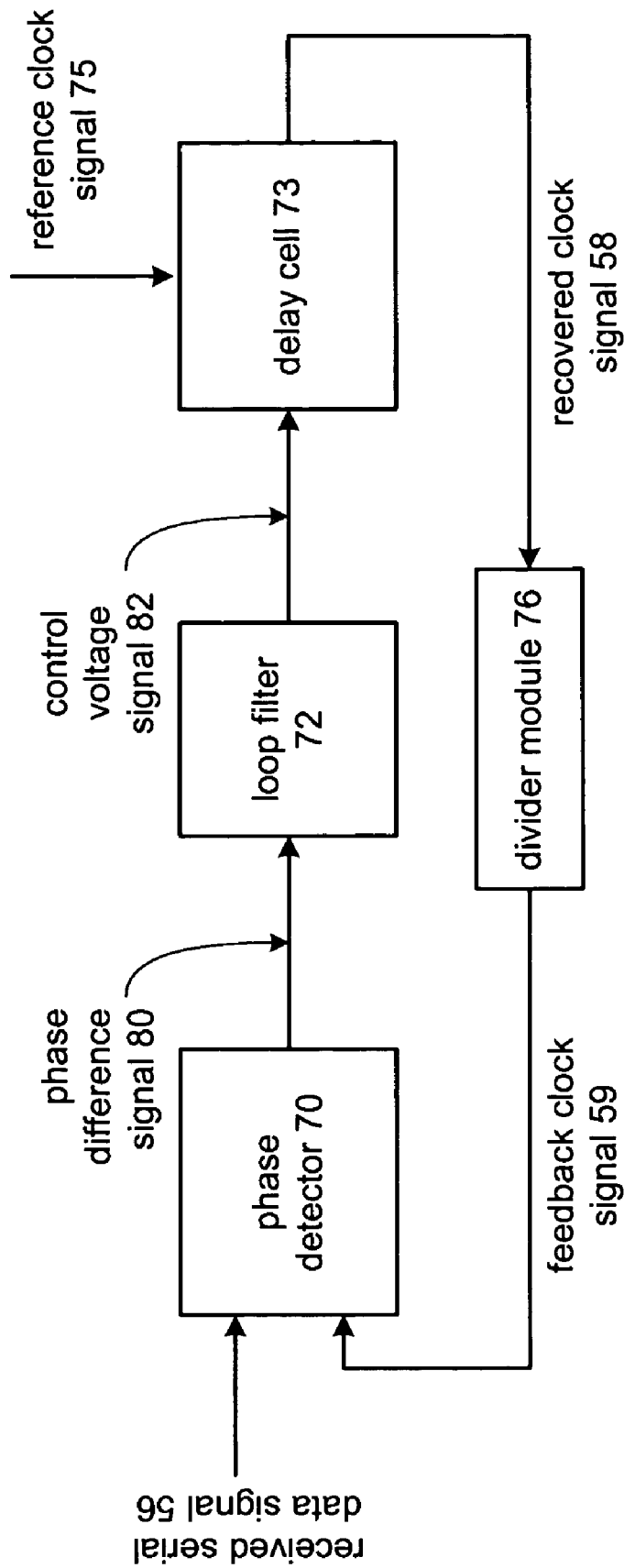
FIG. 18a is a schematic block diagram of an alternative timing recovery circuit in accordance with the present invention.

FIG. 18 is a schematic block diagram of one embodiment of a recovery circuit 30 in accordance with the present invention. Recovery circuit 30 includes a phase detector 70, a loop filter 72, a voltage controlled frequency source 74 and a divider module 76. Alternatively, recovery circuit 30 can include a delay cell 73, having a reference clock signal 75 as an input, instead of voltage controlled frequency source 74. FIG. 18a illustrates this alternative embodiment. The phase detector 70, which may be a bang-bang type phase detector, compares the received serial input data signal 56 with a feedback clock signal 59. If a phase difference exists between the received serial data signal 56 and the feedback clock signal 59, the phase detector 70 generates a difference signal 80.

The loop filter 72 receives the difference signal 80 and produces a control voltage signal 82. The voltage controlled frequency source 74, which may be a voltage controlled oscillator (VCO), is operably coupled to receive the control voltage signal 82 and generate a recovered clock signal 58 therefrom. Alternatively, as shown in FIG. 18a, delay cell 73 can be operably coupled to receive the control voltage signal 82 and delay the reference clock signal 75 based on the control voltage signal 82 to generate the recovered clock signal 58 therefrom. The divider module 76 divides the recovered clock signal 58 to produce the feedback clock signal 59. The divider module 76 can be a divide by n divider module, where n is a positive number. If the divider module is a divide by 1 module, then the feedback clock signal 59 frequency equals the recovered clock signal 58 frequency.

Figure 19:
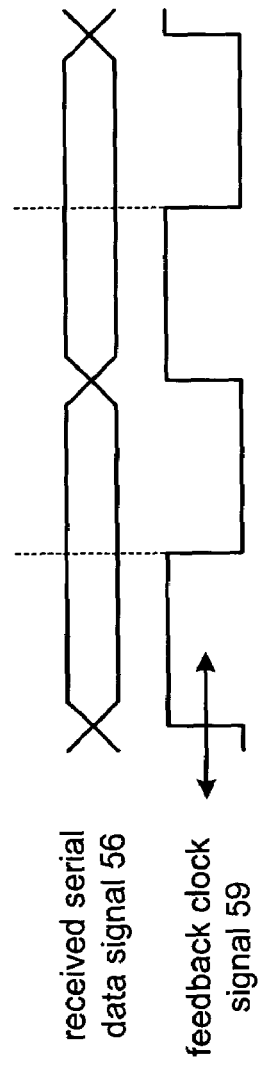
FIG. 19 is a timing diagram illustrating a desired phase alignment between a received serial data signal and a feedback clock signal in accordance with the present invention.

In general, the functionality of the recovery circuit 30 is to align the feedback clock signal 59 with the received serial input data signal 56 to provide optimal sampling by the demultiplexor of the received serial input data signal 56. FIG. 19 illustrates this functionality. As shown, the received serial data signal 56 may be a logic-high or logic-low in transition from cycle-to-cycle. The optimal sampling point of the received serial data signal 56 is in the center of the data (i.e., furthest away from transitions of the data as possible). Accordingly, the feedback clock signal 59 is aligned to have its falling edge, in this example, time aligned with the approximate center of the received serial input data signal 56. Accordingly, to achieve this time alignment, the embodiments of the timing recovery circuit of this invention shift the recovered clock signal 58, and hence the feedback clock signal 59, to provide the desired alignment in accordance with the control voltage signal 82. Although FIG. 19 shows the falling edge of feedback clock signal 59 time aligned with the approximate center of the received serial input data signal 56, either edge of feedback clock signal 59 is acceptable. The choice can depend on, for example, the type of flip-flops comprising phase detector 70 (i.e., whether the selected flip-flops are triggered by the falling or rising edge of a signal).

FIG. 20 is a schematic block diagram of a digital implementation of phase detector 70 and loop filter 72 of FIG. 18 or FIG. 18a according to one embodiment of the timing recovery circuit of this invention. As shown, phase detector 70 includes a decision logic section 88 comprising input logic modules 90, 92, 94 and 96, input exclusive OR (XOR) gates 98, 100, 102, and 104, output logic modules 106, 108, 110 and 112, phase shift logic modules 114 and 116, output or (OR) gates 118 and 120, XOR gate 121 and pre-filter 126. The operation of decision logic section 88 will be familiar to those of average skill in the art.

Input logic modules 90, 92, 94 and 96 are operably coupled to receive serial input data signal 56 and a phase of feedback clock signal 59 and to pass through the clocked serial input data signal 56. Output logic modules 106, 108, 110 and 112 are operably coupled to receive the outputs of input XOR gates 98, 100, 102 and 104 and a phase of feedback clock signal 59. Phase shift logic modules 114 and 116 are operably coupled to phase align the output signals from output logic modules 106 and 108, respectively. Output OR gates 118 and 120 are operably coupled to receive, respectively, the output signals from output logic module 110 and phase shift logic module 114, and output logic module 112 and phase shift logic module 116, to produce timing difference signal 122, and, together with XOR gate 121, transition detect signal 124, as shown. It is contemplated that the functionality of decision logic section 88 can be achieved with various digital logic configurations familiar to those skilled in the art. Logic modules 90, 92, 94, 96, 106, 108, 110, 112, 114 and 116 can be D-type flip-flops. Although FIG. 20 shows zero, ninety, one-eighty and two-seventy degree phases of feedback clock signal 59, any degree phase of feedback clock signal 59 can be used. For example, finer or coarser phase spacings than shown can be used without departing from the scope of this invention.

Decision logic section 88 is operably coupled to generate difference signal 80 based on at least a phase difference between serial input data signal 56 and feedback clock signal 59. Determining the phase difference between serial input signal 56 and feedback clock signal 59 includes digitally determining the timing difference signal 122 between the serial input data signal 56 and the feedback clock signal 59, digitally determining a transition of the serial input data signal 56 to produce transition detect signal 124, and digitally updating the timing difference signal 122 based on the transition detect signal 124 and the feedback clock signal 59.

Pre-filter 126 is operably coupled to receive the timing difference signal 122 and transition detect signal 124 and to pre-filter (update) the timing difference signal 122 based on a pre-filter clock signal 136, which will be shown and discussed with reference to FIGS. 21a and 21b. Pre-filter 126 may be a decimator operable to decimate the timing difference signal 122 based on every nth transition of the serial input data signal 56, or on an average of every n transitions (decisions) of the serial input data signal 56, where n is any positive number. These two decimation schemes are illustrated in FIGS. 21a and 21b, respectively. Pre-filter 126 is designed to pass the phase detector 70 outputs to the digital loop filter 72 and to establish the digital loop filter 72 update in synchronous with the feedback clock signal 59 utilizing decimation based on serial input data signal 56 transitions rather than on a fixed clock period rate.

FIG. 21a is a schematic block diagram of one embodiment of pre-filter 126 for decimation based on taking every nth transition result of serial input data signal 56. FIG. 21a shows the case for n=8. Pre-filter 126 of FIG. 21a includes AND gate 130, counter 132 and logic module 134. AND gate 130 is operably coupled to receive feedback clock signal 59 and transition detect signal 124. Counter 132 is operably coupled to count only in the instance when transition detect signal 124 has a high value (digital "1"). As a result, the counter 132 output, pre-filter clock signal 136, totals only every eight times that serial input data signal 56 transitions. Logic module 134 is operably coupled to receive pre-filter clock signal 136 and timing difference signal 122 to update the timing difference signal 122 based on the pre-filter clock signal 136 to produce the difference signal 80.

FIG. 21b is a schematic block diagram of an alternative embodiment of pre-filter 126 of FIG. 20 for decimation based on taking the average of every n transitions of serial input data signal 56. Decimation based on an average of every n transitions is a more accurate decimation method. A simple algorithm for averaging every N transitions can be written as:

If $^{n-1}\Sigma_{j=0}Dj \geq N/2$ then OUT=1, ELSE OUT=0

As shown in FIG. 21b, pre-filter 126 includes AND gate 130, counter 132 and logic module 134 of FIG. 21a. AND gate 130 is operably coupled to receive feedback clock signal 59 and transition detect signal 124. Counter 132 is operably coupled to count only in the instance when transition detect signal 124 has a high value (digital "1") and generate a pre-filter clock signal 136. In the embodiment of FIG. 21b, however logic module 134 is operably coupled to receive pre-filter clock signal 136 and the output signal from decision logic block 140. Decision logic block 140 in combination with logic modules 150–157 process timing difference signal 122 to update the timing difference signal 122 based on the clock signal 141 output from AND gate 130. Decision logic block 140 is operable to implement a decision logic algorithm such as described above. Logic module 150 receives as a data input the timing difference signal 122 and each subsequent logic module 151–157 receives as a data input the output from the previous logic module as shown. Each logic module 150–157 receives a clock signal, pre-filter sample signal 141, to sample its input. As in FIG. 21a, pre-filter sample signal 141 only totals when transition detect signal 124 is high. Logic module 134 generates difference signal 80 by updating the processed timing difference signal 122 based on the pre-filter clock signal 136. Logic modules 134 and 150–157 can be D-type flip-flops.

Figure 22:
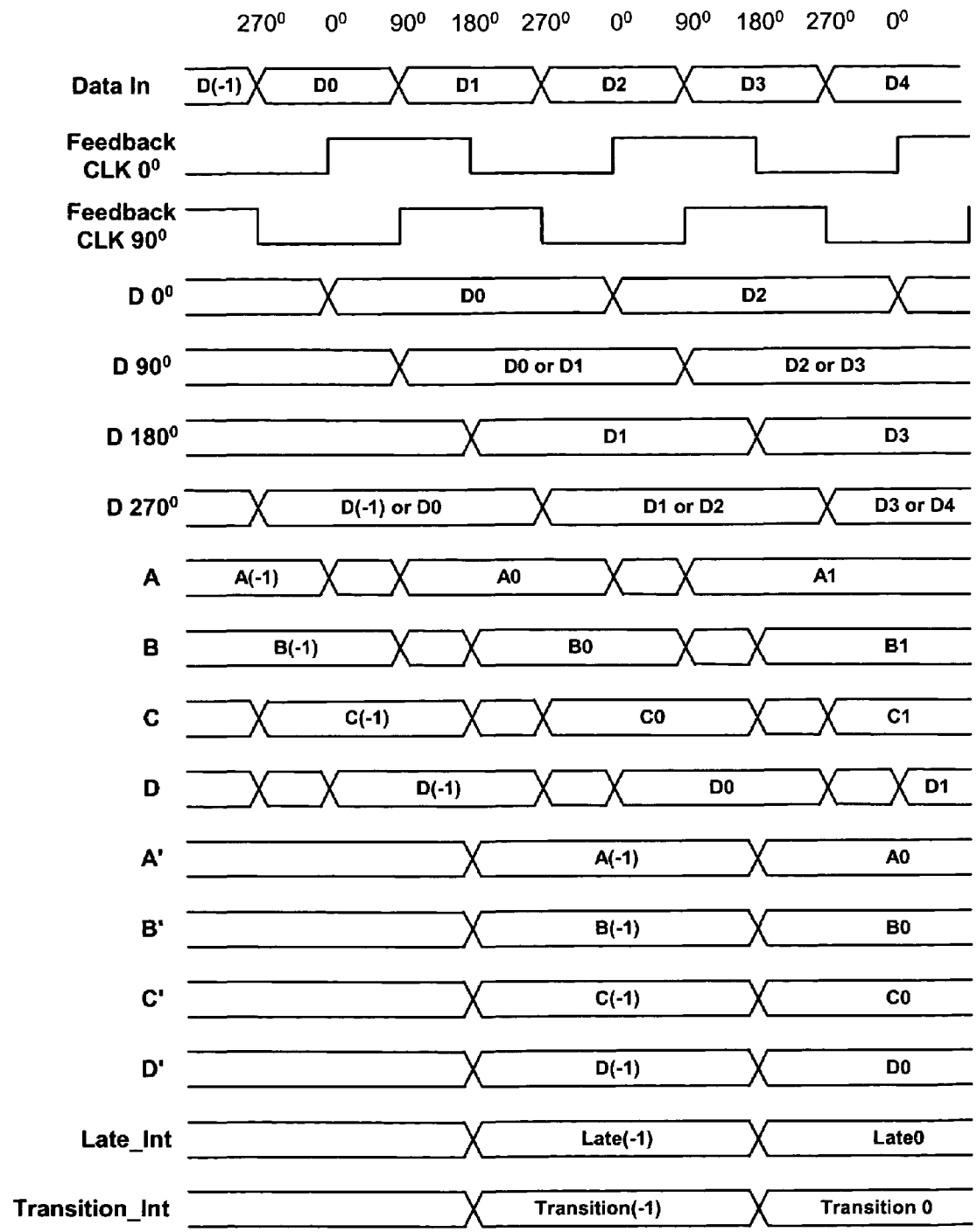
FIG. 22 illustrates a timing diagram for a timing recovery circuit in accordance with the embodiment of FIG. 20.
Figure 23:
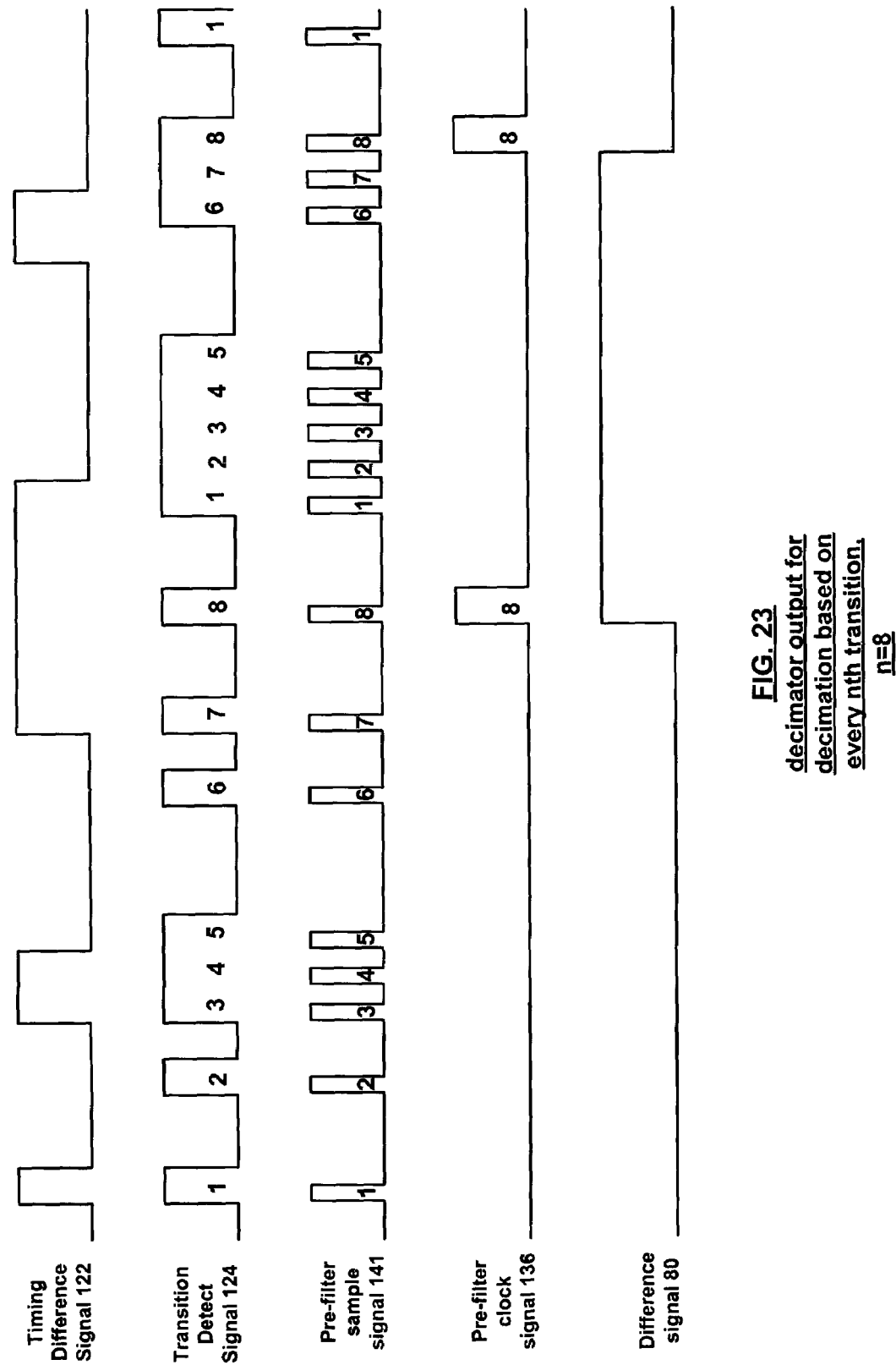

FIG. 22 illustrates a timing diagram for decision logic section 88 of phase detector 70 of the timing recovery circuit of this invention according to the embodiment of FIG. 20. FIG. 23 illustrates a timing diagram for the pre-filter 126 of the timing circuit of this invention according to the embodiment of FIG. 21a. In general, FIG. 22 illustrates how the late/early decisions (i.e., the timing difference) and the transition detect signal, both generated by the phase detector 70, are generated and aligned with the feedback clock signal. FIG. 23 illustrates the timing diagram for pre-filter 126 for the case of decimation based on every eighth transition.

The preceding discussion has presented a timing recovery circuit that may be used in a data recovery circuit of a high-speed serial receiver. Embodiments of the timing recovery circuit of this invention can comprise a data driven phase detector and digital loop filter combination employing a transition-based decimator. This structure can provide the capability of sustaining lock and tracking in the presence of low transition density or isolated transitions between transitionless periods of a serial data input signal. The embodiments of the timing recovery circuit of this invention are capable of extracting the timing information from an isolated single data transition between long transitionless periods and require less data transitions to remain in a locked condition.

The embodiments of the present invention have an added advantage of decoupling the loop update rate and loop bandwidth design parameters. Loop bandwidth can thus be kept very low (in the KHz region) while still realizing a very high speed (in the GHz region) timing recovery operation. The embodiments of the timing recovery circuit of this invention can eliminate incorrect decisions of a traditional prior art phase detector circuit resulting from voltage and timing offsets.

Figure 24:
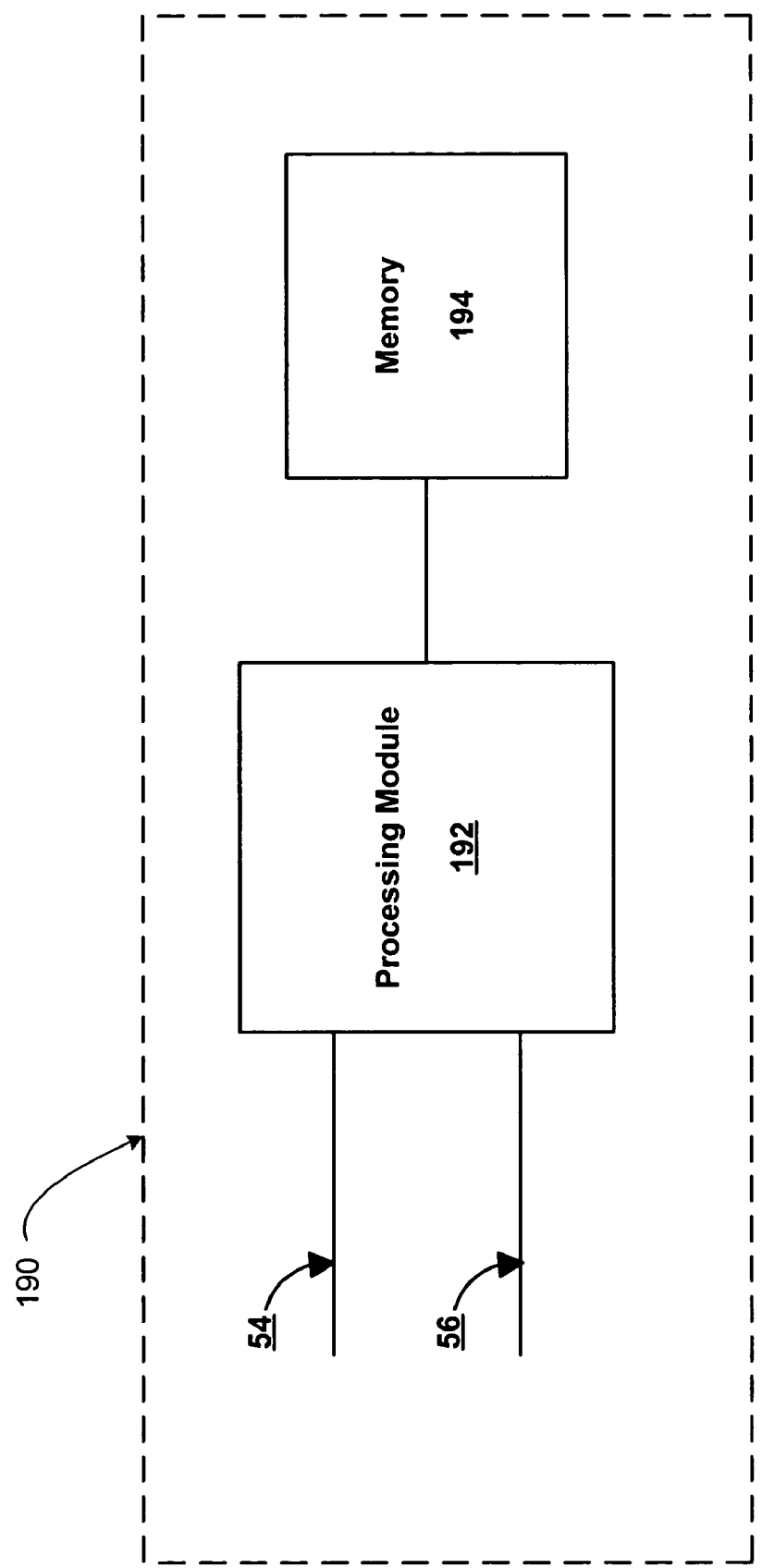
FIG. 24 is a schematic block diagram of an apparatus implementing an embodiment of the timing recovery circuit in accordance with the present invention.

A further embodiment of the present invention can comprise an apparatus for timing recovery from an input signal. As shown in FIG. 24, the apparatus 190 can comprise a processing module 192 and a memory 194. Processing module 192 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 194 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 192 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 194 stores, and the processing module 192 executes, operational instructions corresponding to at least some of the steps and/or functions illustrated in FIGS. 20–23.

In a particular embodiment of apparatus 190, the memory 194 is operably coupled to processing module 192 and includes operational instructions that cause the processing module 192 to determine at least a phase difference between the serial input data signal 56 and a feedback clock signal 59 to produce a difference signal 80, wherein determining the phase difference includes: digitally determining a timing difference signal 122 between the serial input data signal 56 and the feedback clock signal 59; digitally determining a transition of the serial input data signal 56 to produce a transition detect signal 124; and digitally updating the timing difference signal 122 based on the transition detect signal 124 and the feedback clock signal 59; filtering the difference signal 122 to produce a control voltage; generating a recovered clock based on the control voltage; and updating the feedback clock signal 59 based on the recovered clock.

As one of average skill in the art will appreciate, other embodiments may be derived from the teaching of the present invention, without deviating from the scope of the claims.

What is claimed is:

1. A method for timing recovery from an input signal, the method comprises:
   determining at least a phase difference between the input signal and a feedback clock signal to produce a difference signal, wherein determining the phase difference includes:
      digitally determining a timing difference signal between the input signal and the feedback clock signal;
      digitally determining a transition of the input signal to produce a transition detect signal; and
      digitally pre-filtering the timing difference signal and the transition detect signal to produce an updated difference signal and a pre-filtered clock signal that are synchronized with the feedback clock signal;
   filtering the updated difference signal based on the pre-filtered clock signal to produce a control voltage;
   generating a recovered clock based on the control voltage; and
   updating the feedback clock signal based on the recovered clock.

2. The method of claim 1, wherein the pre-filtering further comprises decimating the timing difference signal based on every nth transition of the input signal.

3. The method of claim 1, wherein the pre-filtering further comprises decimating the timing difference signal based on an average of every n timing difference decisions.

4. The method of claim 1, wherein generating the recovered clock comprises delaying a reference clock based on the control voltage.

5. The method of claim 1, wherein the recovered clock is generated based on a voltage controlled frequency source and the control voltage.

6. The method of claim 1, wherein updating the feedback clock signal comprises dividing the recovered clock by n to generate the feedback clock signal, where n is any positive number.

7. The method of claim 1, wherein digitally determining the timing difference between the input signal and the feedback clock signal further comprises bang-bang phase detecting die timing difference between the input signal and the feedback clock signal.

8. The method of claim 1, wherein digitally determining the transition of the input signal further comprises bang-bang phase detecting the input signal and the feedback clock signal to detect the input signal transition.

9. A timing recovery circuit comprises:
   a phase detector, operably coupled to determine at least a phase difference between an input signal and a feedback clock signal to produce a difference signal, wherein determining the phase difference includes:
      digitally determining a timing difference signal between the input signal and the feedback clock signal;
      digitally determining a transition of the input signal to produce a transition detect signal; and
      digitally pre-filtering the timing difference signal and based on the transition detect signal to produce an updated difference signal and a pre-filtered clock signal that are synchronized with the feedback clock signal;
   a loop filter operably coupled to digitally filter the updated difference signal based on the pre-filtered clock signal to produce a control voltage; and
   a recovered clock generation module operably coupled to generate a recovered clock based on the control voltage.

10. The timing recovery circuit of claim 9, wherein the phase detector comprises:
    a digital pre-filter that digitally pre-filters the timing difference signal, wherein the digital pre-filter is a decimator operable to decimate the timing difference based on every nth transition of the input signal.

11. The timing recovery circuit of claim 9, wherein the phase detector comprises:
    a digital pre-filter that digitally pre-filters the timing difference signal and the transition detect signal, wherein the digital pre-filter is a decimator operable to decimate the timing difference based on an average of every n timing difference decisions.

12. The timing recovery circuit of claim 9, wherein the recovered clock generation module is a delay cell operably coupled to delay a reference clock based on the control voltage to generate a recovered clock.

13. The timing recovery circuit of claim 12, further comprising a divider module operably coupled to divide the recovered clock by n to update the feedback clock signal.

14. The timing recovery circuit of claim 9, wherein the recovered clock generation module is a voltage controlled frequency source.

15. The timing recovery circuit of claim 14, further comprising divider module operably coupled to divide the recovered clock by n to update the feedback clock signal.

16. The timing recovery circuit of claim 9, wherein the phase detector is a bang-bang type phase detector.

17. An apparatus for timing recovery from an input signal, the apparatus comprises:
    a processing module; and
    a memory operably coupled to the processing module, wherein the memory includes operational instructions that cause the processing module to:
    determine at least a phase difference between the input signal and a feedback clock signal to produce a difference signal, wherein determining the phase difference includes:
       digitally determining a timing difference signal between the input signal and the feedback clock signal;
       digitally determining a transition of the input signal to produce a transition detect signal; and
       digitally pre-filtering the timing difference signal and the transition detect signal to produce an updated timing difference signal and a pre-filtered clock signal that are synchronized with the feedback clock signal;

filter the updated difference signal based on the pre-filtered clock signal to produce a control voltage;

generate a recovered clock based on the control voltage; and update the feedback clock signal based on the recovered clock.

18. The apparatus of claim 17, wherein the pre-filtering further comprises decimating the timing difference signal based on every nth transition of the input signal.

19. The apparatus of claim 17, wherein the pre-filtering further comprises decimating the timing difference signal based on an average of every n timing difference decisions.

20. The apparatus of claim 17, wherein generating the recovered clock comprises delaying a reference clock based on the control voltage.

21. The apparatus of claim 17, wherein the recovered clock is generated based on a voltage controlled frequency source and the control voltage.

22. The apparatus of claim 17, wherein updating the feedback clock signal comprises dividing the recovered clock by n to generate the feedback clock signal, where n is a positive whole number.

23. The apparatus of claim 17, wherein digitally determining the timing difference between the input signal and the feedback clock signal further comprises bang-bang phase detecting the timing difference between the input signal and the feedback clock signal.

24. The apparatus of claim 17, wherein digitally determining the transition of the input signal further comprises bang-bang phase detecting the input signal and the feedback clock signal to detect the input signal transition.

25. An optical receiver comprises:

a timing recovery circuit operably coupled to recover a clock signal from a received serial input signal, wherein the timing recovery circuit comprises:

a phase detector, operably coupled to determine at least a phase difference between the input signal and a feedback clock signal to produce a difference signal, wherein determining the phase difference includes:

digitally determining a timing difference signal between the input signal and the feedback clock signal;

digitally determining a transition of the input signal to produce a transition detect signal; and digitally pre-filtering the timing difference signal and the transition detect signal to produce an updated difference signal and a pre-filtered clock signal that are synchronized with the feedback clock signal;

a loop filter operably coupled to filter the updated difference signal based on the pre-filtered clock signal to produce a control voltage; and a recovered clock generation module operably coupled to generate a recovered clock based on the control voltage.

26. The optical receiver of claim 25, wherein the phase detector comprises:

a digital pre-filter coupled to pre-filter the timing difference signal and the transition detect signal, wherein the digital pre-filter is a decimator operable to decimate the timing difference signal based on every nth transition of the input signal.

27. The optical receiver of claim 25, wherein the phase detector comprises:

a digital pre-filter coupled to pre-filter the timing difference signal and the transition detect signal, wherein the digital pre-filter is a decimator operable to decimate the timing difference based on an average of every n timing difference decisions.

28. The optical receiver of claim 25, wherein the recovered clock generation module is a delay cell operably coupled to delay a reference clock based on the control voltage to generate a recovered clock.

29. The optical receiver of claim 28, further comprising a divider module operably coupled to divide the recovered clock by n to update the feedback clock signal.

30. The optical receiver of claim 25, wherein the recovered clock generation module is a voltage controlled frequency source.

31. The optical receiver of claim 30, further comprising a divider module operably coupled to divide the recovered clock by n to update the feedback clock signal.

32. The optical receiver of claim 25, wherein the phase detector is a bang-bang type phase detector.

* * * * *